(12) United States Patent
Adan et al.

(10) Patent No.: US 7,567,610 B2
(45) Date of Patent: Jul. 28, 2009

(54) FREQUENCY CONVERSION CIRCUIT, RADIO FREQUENCY WAVE RECEIVER, AND RADIO FREQUENCY TRANSCEIVER

(75) Inventors: Alberto O. Adan, Ikoma (JP); Shinji Kamiya, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 638 days.

(21) Appl. No.: 10/976,500

(22) Filed: Oct. 29, 2004

(65) Prior Publication Data

US 2005/0117664 A1 Jun. 2, 2005

(30) Foreign Application Priority Data

Oct. 31, 2003 (JP) .............................. 2003-372535

(51) Int. Cl.
H04B 1/38 (2006.01)
(52) U.S. Cl. ........................................ 375/219; 455/73
(58) Field of Classification Search .................. 375/319
See application file for complete search history.

(56) References Cited

U.S. PATENT DOCUMENTS

| 6,351,502 | B1 | 2/2002 | Zargari | |
|---|---|---|---|---|
| 7,079,596 | B1 * | 7/2006 | Namura | ...................... 375/324 |
| 2002/0164961 | A1 * | 11/2002 | Atkinson et al. | .............. 455/86 |
| 2003/0219067 | A1 * | 11/2003 | Birkett et al. | ................ 375/219 |
| 2004/0264396 | A1 * | 12/2004 | Ginzburg et al. | ............ 370/311 |

FOREIGN PATENT DOCUMENTS

| JP | 2000-299646 | 10/2000 |
|---|---|---|
| JP | 2001-086024 | 3/2001 |
| JP | 2001086024 A * | 3/2001 |
| JP | 2001-168934 | 6/2001 |
| JP | 2003-188753 | 7/2003 |

OTHER PUBLICATIONS

Fong, K.L. et al. (Aug. 1997). "A Class AB Monolithic Mixer for 900-MHz Applications," *IEEE Journal of Solid-State Circuits*, 32(8):1166-1172.
Zolfaghari, A. et al. (Feb. 2003). "A Low-Power 2.4-GHz Transmitter/Receiver CMOS IC," *IEEE Journal of Solid-State Circuits*, 38(2):176-183.

* cited by examiner

*Primary Examiner*—Shuwang Liu
*Assistant Examiner*—David Huang
(74) *Attorney, Agent, or Firm*—Morrison & Foerster LLP

(57) ABSTRACT

A frequency conversion circuit of the present invention includes: (i) a first mixer for mixing the radio frequency signal having a frequency $f_{RF}$ with a first oscillation signal having a frequency $f_{LO1}$ so that the radio frequency signal is downconverted into an intermediate frequency signal; and (ii) a second mixer for mixing the intermediate frequency signal sent from the first mixer with two local oscillation signals so that the intermediate frequency signal is downconverted into two base-band signals having different phases. The second local oscillation signals have phases of 0° and 270°, respectively. These frequencies satisfies:

$f_{LO1} = k \times f_{RF} (k>1)$ $f_{LO2} = f_{LO1}/m, (m>1)$ $k = m/(m-1)$.

This arrangement ensures (i) a small frequency conversion circuit that can be mounted on an integrated circuit, (ii) a radio frequency receiver including the frequency conversion circuit, and (iii) a radio frequency transceiver including the radio frequency receiver.

4 Claims, 16 Drawing Sheets

WHEN RECEIVING

WHEN TRANSMITTING

FREQUENCY CONVERSION CIRCUIT, RADIO FREQUENCY WAVE RECEIVER, AND RADIO FREQUENCY TRANSCEIVER

This Nonprovisional application claims priority under 35 U.S.C. § 119(a) on Patent Application No. 2003/372535 filed in Japan on Oct. 31, 2003, the entire contents of which are hereby incorporated by reference.

FIELD OF THE INVENTION

The present invention relates to a radio frequency (RF) receiver and a radio frequency transceiver (i) that can extract, with the use of a quadrature mixer, a signal encoded based on an in-phase signal and a quadrature signal, and (ii) that are applicable to a mobile communication system such as a mobile phone, a PHS (Personal Handyphone System), or the like, and are also applicable to a wireless data communication system, which is compliant with the IEEE 802.11x standard, such as a wireless local area network (LAN) communication system, and further relates to a frequency conversion circuit for suitably use in the radio frequency (RF) receiver and the radio frequency transceiver.

BACKGROUND OF THE INVENTION

FIG. 10 illustrates a typical conventional radio frequency transceiver. The radio frequency transceiver includes an antenna 1, a radio frequency pre-select filter (band-pass filter (BPF)) 2, a duplex switch 3, a receiving channel, and a transmitting channel. The antenna 1 is connected to the channel for a receiving device 1004, or to the channel for a transmitting device 1005, via the duplex switch 3. The radio frequency transceiver is used to convert a base-band (BB) data (signal) into a radio frequency signal. Generally, in terms of a signal energy frequency, a base-band signal has a frequency range of direct current to several tens of MHz, whereas a radio frequency carrier wave has a frequency region of GHz. More specifically, for example, a wireless local area network (WLAN) transceiver is compliant with the IEEE 802.11b standard. In such a WLAN transceiver, a base-band signal has a frequency range of direct current to 11 MHz, whereas a radio frequency carrier wave varies depending on a selected channel, i.e., has a frequency range of 2412 MHz to 2484 MHz.

Meanwhile, there are several methods for carrying out a frequency conversion from a base-band signal to a radio frequency signal in the transmitting channel, and a frequency conversion from a radio frequency signal to a base-band signal in the receiving channel. All of the methods employ one or more mixers for upconversion or downconversion of frequency.

FIG. 11 illustrates a well-known heterodyne (or a super-heterodyne) system in which a two-stage downconversion into a base-band signal is carried out with respect to a radio frequency signal (i.e., a received signal superimposed on a radio frequency carrier wave) in a receiving channel. Specifically, in the first stage downconversion, the received signal, on the radio frequency carrier wave having a frequency $f_{RF}$, is amplified by a low noise amplifier (LNA) 4. The received signal thus amplified are mixed, by a first mixer 5, with an output signal having a frequency $f_{LO}$ that is sent from a first local oscillator (LO). The oscillator (LO) is made up of a phase-locked loop (PLL) circuit PLL1 and a voltage controlled oscillator (VCO) VCO1. The mixing allows a down-converted signal, which has been subject to the first stage downconversion and has a frequency of $f_1$ ($f_1 = f_{RF} - f_{LO}$), to be outputted via an output terminal of the first mixer 5. Generally, the radio frequency transceiver includes a band-pass filter 6 or an LC load so that an interference signal or noise is removed from a frequency band near the frequency $f_1$. The LC load is disclosed, for example, in K. L Fong, C. D. Hull and R. G. Meyer, "A Class AB Monolithic Mixer for 900-MHz Applications", IEEE Journal of Solid-State Circuits, vol.32, pp.1166-1172, August 1997 (hereinafter, referred to as "nonpatent document 1"). Note that, in the WLAN IEEE 802.11b transceiver, the frequency $f_1$ is approximately 374 MHz.

In the second stage downconversion, a carrier wave having the frequency $f_1$ is mixed, by a second mixer 7, with an output signal, having a frequency $f_{IF}$, that is sent from a second local oscillator made up of a phase-locked loop circuit PLL2 and a voltage controlled oscillator VCO2. This mixing allows generation of a base-band signal. Note that, in this example, the output signal of the second local oscillator has the frequency $f_{IF}$ of 374 MHz. The second mixer 7 outputs a base-band signal having a frequency $f_{BB}$. Thereafter, the base-band signal is filtered by a low-pass filter 8, and then the signal thus filtered is amplified by an amplifier 9. The signal thus amplified is converted into a digital signal by an analog/digital converter (ADC) 10. After that, a digital processing is carried out with respect to the digital signal.

On the other hand, in a transmitting channel, a digital base-band signal is converted into an analog base-band signal by a digital/analog converter (DAC) 11. Then, the analog base-band signal is filtered by a low-pass filter 12 so that interference is reduced, and so that bandwidth of the analog base-band signal is controlled. The signal thus filtered is mixed, by an intermediate frequency (IF) mixer 13, with an output signal sent from the second local oscillator. This allows upconversion of the signal from base band to the frequency $f_1$. The signal thus upconverted is filtered by a band-pass filter 18. The signal thus filtered is mixed, by a mixer 14, with an output signal of the first local oscillator so as to be upconverted again. The signal thus upconverted is amplified by a power amplifier (PA) 17 so as to obtain sufficient electric power for driving the antenna 1. Note that a band-pass filter 16 is provided between the mixer 14 and the power amplifier 17.

FIG. 12 illustrates how a frequency spectrum changes in accordance with the downconversion of the heterodyne transceiver.

Here, there is a signal having a frequency which keeps a frequency of a desired radio frequency signal away from the frequency of the output signal of the first local oscillator. During the mixing processing of the first mixer 5, such a signal is downconverted into a signal having the frequency $f_1$, like the desired radio frequency signal.

This is the well-known weakness of the heterodyne system. As shown in FIG. 12, when the desired frequency $f_{RF}$ of the radio frequency signal is higher than the frequency $f_{LO}$ of the output signal of the first local oscillator (i.e., $f_{RF} > f_{LO}$), there is an unwanted signal having a frequency $f_{IM}$ ($f_{IM} < f_{LO}$). The unwanted signal having the frequency $f_{IM}$ is called an "image signal" in technical term, and satisfies the following relation:

$$f_{RF} - f_{LO} = f_{LO} - f_{IM}$$

The image signal is downconverted into a signal having the frequency $f_1$ like the desired radio frequency signal. (The frequency $f_{IM}$ of the image signal is called an "image frequency".) Specifically, in the WLAN IEEE 802.11b transceiver, if it is assumed that the frequency $f_{LO}$ of the first local oscillator is 2038 MHz and the frequency $f_{RF}$ of the desired radio frequency signal is 2412MHz, then the image frequency $f_{IM}$ is 1664 MHz.

In order to avoid interference of the image signal, used is a direct conversion transceiver shown in FIG. 13 (also known as a homodyne transceiver). The direct conversion transceiver carries out, in a single mixing step, a frequency conversion from a radio frequency signal to a base-band signal, and a frequency conversion from a base-band signal to a radio frequency signal. For example, in a receiving channel of the transceiver, a radio frequency signal having the frequency $f_{RF}$ is amplified, and the signal thus amplified is mixed, by a mixer 21A and a mixer 21B, with local oscillation signals each having the frequency $f_{LO}$ ($f_{LO}=f_{RF}$). This allows the radio frequency signal to be downconverted into a signal having a base band component.

As such, the direct conversion transceiver can prevent the problem of the image signal.

Meanwhile, as a substitution of the heterodyne transceiver, disclosed in U.S. Pat. No. 6,351,502 B1 (published on Feb. 26, 2002; hereinafter, referred to as "patent document 1") is so-called a dual conversion transceiver. FIG. 14 illustrates the dual conversion transceiver.

The dual conversion transceiver is one of the heterodyne transceivers because two-stage conversion of a radio frequency signal to a base-band signal is carried out by a first mixer 106 and I/Q (I: in-phase, Q: quadrature) mixers 108A and 108B.

The dual conversion transceiver is also easily affected by the image signal having the frequency $f_{IM}$ ($f_{IM}=2f_{LO}-f_{RF}$). In the dual conversion system of the patent document 1, the frequency $f_{RF}$ is 5.2 GHz, the frequency $f_{LO}$ is 4.24 GHz, and the image frequency $f_{IM}$ is 3.28 GHz. This allows the image frequency $f_{IM}$ to be out of band of a low noise amplifier 105. Accordingly, the image signal is greatly attenuated.

Meanwhile, another dual conversion transceiver is disclosed in A. Zolfaghani and B. Razavi, "A Low-Power 2.4-GHz Transmitter/Receiver CMOS IC, IEEE Journal of Solid-State Circuits, vol.38, pp. 176-183, February 2003 (hereinafter, referred to as "non-patent document 2"). FIG. 15 illustrates a structure of such another dual conversion transceiver.

Further, a circuit (see FIG. 16) is disclosed as a double conversion tuner in Japanese Laid-Open Patent Application Tokukai 2000-299646 (published on Oct. 24, 2000; hereinafter, referred to as "patent document 2").

A first mixer 402 mixes a radio frequency signal with a clock signal (local oscillation signal) having a frequency $f_{LO1}$ that is sent from a voltage controlled oscillator 406. This allows the downconversion of the radio frequency signal. A second mixer 404 mixes (i) the signal thus obtained by downconverting the radio frequency signal by using the frequency $f_{LO1}$ with (ii) a clock signal having a frequency $f_{LO2}$ that is received from a crystal-controlled oscillator (XCO) 412. The two clock signals satisfy the following relation:

$$f_{LO1}=f_{LO2}\times(N/M).$$

However, the conventional radio frequency transceivers have a problem in being fully mounted in an integrated circuit (IC) or an IC chip as follows.

Specifically, the heterodyne radio frequency transceiver requires a bulky filter, provided outside the IC chip, for restraining the image signal. This results in that the heterodyne radio frequency transceiver cannot be fully mounted in the IC chip (integrated circuit). Further, in order to drive the surface acoustic wave filter provided outside the IC chip, it is necessary to output, to the outside of the IC chip, the radio frequency signal amplified by a low noise amplifier. As such, it is necessary for the heterodyne radio frequency transceiver to further include a buffer amplifier. This causes an increase in power consumption of the IC chip (integrated circuit).

As for the heterodyne radio frequency transceiver shown in FIG. 11, the heterodyne radio frequency transceiver additionally includes a band-pass filter 15 so that the image signal is attenuated. The band-pass filter 15 is made up of bulky and discrete components so that an image signal removing characteristic is obtained. The band-pass filter 15, however, hinders the heterodyne radio frequency transceiver from being mounted in an integrated circuit. This causes the heterodyne radio frequency transceiver to be expensive, and to have extra power consumption.

The patent document 2 relates to a double conversion system that is applied to a tuner. Because the double conversion system is basically one of the heterodyne systems, the double conversion system also has the foregoing problems (i.e., the impossibility of the full mounting in an integrated circuit, and the increase in the power consumption of the integrated circuit).

According to the system disclosed in the patent document 2, the frequency $f_{LO2}$ of the second local oscillation signal used by the second mixer 404 is fixed. This means that the frequency $f_{LO2}$ does not change according to the frequency $f_{LO1}$ of the first local oscillation signal used by the first mixer 402. Therefore, when the frequency $f_{LO1}$ of the first local oscillation signal changes, a ratio of the frequency $f_{LO1}$ of the first oscillation signal to the frequency of the second oscillation signal deviates from an initial setting value.

Further, according to the system of the patent document 2 the following relation is satisfied:

$$f_{LO1}-f_{LO2}=1.0101\times f_{RF}$$

This means that the downconversion in the patent document 2 is not a downconversion to direct current, but a downconversion to a second intermediate frequency (IF) band (2.048 MHz). Therefore, the double conversion tuner of the patent document 2 is not applicable to a transceiver for carrying out a downconversion from a radio frequency signal to a base-band signal.

Furthermore, when the intermediate frequency $f_{LO2}$ is 800 MHz, the double conversion system of the patent document 2 requires a voltage controlled oscillator controlled by the phase-locked loop circuit, instead of the crystal-controlled oscillator.

Although the direct conversion system solves the problem of the image frequency, the direct conversion system has deterioration in sensitivity. Further, the direct conversion system has a dynamic direct current offset at an output terminal of the mixer. This is because the signal of the local oscillator leaks into a radio frequency port, and is subject to self-mix. Generally, in the direct conversion system, it is necessary for the low noise amplifier to have a high gain. This causes a possible increase in power consumption.

Meanwhile, also easily affected by the image signal are the conventional dual conversion transceivers (see FIG. 14 and FIG. 15) disclosed in the patent document 1 and the non-patent document 2, respectively. As such, normally, it is necessary to include a kind of bulky filter for restraining the interference of the image signal. Further, the lower the frequency of the image signal becomes, the larger the filter becomes. As such, as the frequency of the radio frequency signal becomes lower ($\leqq$2.4 GHz), this kind of problem goes worse (i.e., the filter occupies a much larger area).

According to the transceiver disclosed in the non-patent document 2, it is necessary to remove the image signal with the use of the filter on the IC chip. In the transceiver disclosed in the non-patent document 2, the following relations are satisfied by the frequency $f_{RF}$ of the radio frequency signal, the frequency $f_{LO}$ of the local oscillation signal used for the first stage downconversion, the frequency $f_{IF}$ of the intermediate signal obtained by the first stage downconversion, and the frequency $f_{IM}$ of the image signal:

$$f_{RF}=2.4 \text{ GHz};$$

$$f_{LO}=(2/3)f_{RF};$$

$$f_{IM}=f_{LO}-f_{IF}$$

Therefore, the frequency $f_{IM}$ of the image signal is 800 MHz. Because the image signal has such a low frequency $f_{IM}$ of 800 MHz, the filter on the IC chip normally needs a larger area.

Further, the patent document 1 suggests that the frequency $f_{LO1}$ of the first local oscillation signal LO107 (i.e., the signal LO107 supplied to the first mixer 106 in the patent document 1) is changed into a higher frequency than the frequency $f_{RF}$ of the radio frequency signal. However, because the transceiver disclosed in the patent document 1 uses local oscillation signals I and Q, having phases of 0° and 90°, which are supplied to the I/Q mixers 108A and 108B, respectively, the transceiver does not appropriately operate. Namely, if signals having phases of 0° and 90° are used as the second local oscillation signals LO2 (I and Q), respectively, under the condition of $f_{LO1}>f_{RF}$, then the radio frequency transceiver does not appropriately operate.

Here, this problem is explained in detail. Firstly explained is a change in frequency spectrums when $f_{LO1}<f_{RF}$ is satisfied. The radio frequency signal has a certain frequency component which is included in a side band (i.e., a frequency component higher than the carrier wave). Such a frequency component still stays higher than the carrier wave even after the first stage downconversion. Under the circumstances, if the second stage downconversion is carried out, by using the local oscillation signals having phases of 0° and 90°, with respect to the frequency component, then an extracted base-band signal has a counterclockwise voltage vector (i.e., a rotation direction which is headed from I (0°) to Q (90°)). Therefore, modulation is properly accomplished.

Next, when $f_{LO1}>f_{RF}$ is kept satisfied, the first stage downconversion causes the frequency component which is included in the side band to be lower than the carrier wave. Under the circumstances, if the second stage downconversion is carried out, by using the local oscillation signals having phases of 0° and 90°, with respect to the frequency component, then an extracted base-band signal has a clockwise voltage vector (i.e., a rotation direction which is headed from Q (90°) to I (0°)). Therefore, modulation cannot be properly accomplished.

SUMMARY OF THE INVENTION

An object of the present invention is to provide (i) a frequency conversion circuit that can be mounted in an integration circuit, and that can be downsized, (ii) a radio frequency receiver including the frequency conversion circuit, and (iii) a radio frequency transceiver including the radio frequency receiver.

To achieve the object, a frequency conversion circuit of the present invention, which downconverts a radio frequency signal having a desired frequency to two base-band signals having different phases, is characterized by comprising: a first mixer for mixing the radio frequency signal with a first oscillation signal so that the radio frequency signal is downconverted into an intermediate frequency signal; and a second mixer for mixing the intermediate frequency signal received from the first mixer with two second local oscillation signals having different phases, respectively, so that the intermediate frequency signal is downconverted into the two base-band signals, the two second local oscillation signals having phases of 0° and 270°, respectively, and fLO1=k×fRF, fLO2=fLO1/m, and k=m/(m−1) being satisfied, where fRF indicates a frequency of the radio frequency signal, fLO1 indicates a frequency of the first local oscillation signal, fLO2 indicates frequencies of the second local oscillation signals, k indicates an arbitrary number satisfying k>1, and m indicates an arbitrary number satisfying m>1.

The relations can also described as follows:

$$f_{LO1}>f_{RF}>0, f_{LO2}<f_{LO1}$$

$$f_{LO2}=f_{LO1}-f_{RF}$$

Namely, the relations can be expressed like the following (1) and (2): (1) the frequency $f_{LO1}$ of the first local oscillation signal is higher than the frequency $f_{RF}$ of the radio frequency signal (this allows the frequency $f_1$ of the intermediate signal to satisfy a relation of $f_1=f_{LO1}-f_{RF}$), and (2) the frequency $f_{LO2}$ of the second local oscillation signal is equal to the frequency $f_1$ of the intermediate signal (this allows the frequency $f_{LO2}$ of the second local oscillation signals to be lower than the frequency $f_{LO1}$ of the first local oscillation signal). Note that, in the frequency conversion circuit having the arrangement, k generally falls within a range specified by $1.125 \leq k \leq 1.35$.

Further, it is preferable to arrange the frequency conversion circuit so that $m=2^n$ are satisfied, where m is an integer and n is a positive integer.

It is preferable to arrange so that the frequency conversion circuit further includes an image signal removal filter for removing an image signal from an output signal of the first mixer. It is preferable that the image signal removal filter can reduce, by 10 dB or greater, the image signal for the image frequency $f_{IM}$ ($f_{IM}=2f_{LO1}-f_{RF}$) or for a frequency higher than the image frequency $f_{IM}$.

It is also preferable to arrange the frequency conversion circuit so that an oscillator for generating the first local oscillation signal, and a divider for dividing the frequency of the first local oscillation signal into 1/m so as to generate the second local oscillation signals having the phases of 0° and 270°, respectively.

To achieve the object, a radio frequency receiver of the present invention which receives a radio frequency carrier wave having a desired frequency, is characterized by including the frequency conversion circuit of the present invention.

It is preferable that the radio frequency receiver is arranged so as to further include: (i) a band-pass filter for receiving radio frequency signal, and for causing radio frequency signal within a band including the frequency of the radio frequency carrier wave to pass through the band-pass filter; and (ii) a low noise amplifier for amplifying the radio frequency signal having passed through the band-pass filter. It is preferable that the low noise amplifier attenuates an image signal interfering with a band in use to such a degree that the image signal substantially vanishes.

It is more preferable that the radio frequency receiver further includes: (i) a low-pass filter for carrying out a low-pass filtering with respect to the base-band signals generated by the frequency conversion circuit, the base-band signals having different phases each other; and (ii) an amplifier for amplifying the base-band signals.

To achieve the foregoing object, a radio frequency transceiver of the present invention is characterized by including: the radio frequency receiver of the present invention, and a radio frequency transmitter for transmitting a carrier wave having a radio frequency.

It is preferable to arrange the radio frequency transceiver so that the radio frequency transmitter includes a quadrature modulator for upconverting the base-band signals directly into a radio frequency signal having the frequency $f_{RF}$, the quadrature modulator including: a third mixer for mixing an in-phase component of the base-band signal with a clock signal having the frequency $f_{RF}$ and a phase of 0°; and a fourth mixer for mixing a quadrature component of the base-band signal with a clock signal having the frequency $f_{RF}$ and a phase of 90°.

It is preferable that the radio frequency transceiver is arranged so as to further include: (i) an oscillator for generating the first local oscillation signal; (ii) a divider for dividing the frequency of the first local oscillation signal into 1/m so as to generate the second local oscillation signals having phases 0° and 270°, respectively; (iii) a fifth mixer for mixing the first local oscillation signal generated by the oscillator with the second local oscillation signal, having the phase of 0°, generated by the divider so as to generate a clock signal having the frequency $f_{RF}$ and a phase of 0°; and (iv) a sixth mixer for mixing the first local oscillation signal generated by the oscillator with the second local oscillation signal, having the phase of 270°, generated by the divider so as to generate a clock signal having the frequency $f_{RF}$ and a phase of 90°. It is preferable that the oscillator is a voltage controlled oscillator which operates at the frequency $f_{LO1}$ of the first local oscillation signal, and is controlled by a phase-locked loop circuit, and is built in the phase-locked loop circuit.

It is more preferable that the radio frequency transceiver is arranged so that the radio frequency transmitter further includes: (i) a low-pass filter for limiting bandwidth of in-phase component and quadrature component of base-band signals obtained by carrying out an analog conversion with respect to a digital data that is to be transmitted; and (ii) an amplifier for amplifying electric power of the radio frequency signal obtained by the upconversion carried out by the quadrature modulator.

It is more preferable that the radio frequency transceiver further include: a signal generator for generating the first local oscillation signal and the second local oscillation signals, and for sending the first and the second local oscillation signals to the frequency conversion circuit provided in the radio frequency receiver, wherein: the signal generator generates clock signals (radio frequency signals having the frequency $f_{RF}$) used for the upconversion in the radio frequency transmitter, and sends the clock signals to the radio frequency transmitter.

It is more preferable that the radio frequency transceiver further includes: (i) an antenna for receiving the radio frequency carrier wave, the antenna being so designed as to operate efficiently at the desired frequency; and (ii) switching means for switching between (a) a receiving mode in which the switching means connects the antenna to the radio frequency receiver and (b) a transmitting mode in which the switching means connects the antenna to the radio frequency transmitter, (iii) circuit components, for generating the clock signals, in the signal generator stopping operating during the receiving mode. In the radio frequency transceiver, it is preferable that, during the receiving mode, (i) the circuit components, for generating the clock signals, in the signal generator stop operating, and (ii) the transmitter channel for transmitting the clock signals from the signal generator to the radio frequency transmitter is cut off.

With the present invention, because the frequency $f_{LO2}$ of the second local oscillation signals is equal to the frequency $f_1$ of the intermediate signal, the second mixer can convert the intermediate frequency signal to the direct current base-band signals (DC). Further, with the frequency conversion circuit of the present invention, because the two-stage downconversion is carried out with respect to the radio frequency signal, a high selectivity and a high sensitivity can be achieved.

Further, according to the present invention, because the frequency $f_{LO1}$ of the first local oscillation signal is higher than the frequency $f_{RF}$ of the radio frequency signal, it is possible for the image signal which interferes with a band in use to shift to a high frequency. As such, when appropriately selecting the frequency $f_{LO1}$ of the first local oscillation signal, it is possible for the image signal to shift toward a frequency (for example, 4 GHz) that is out of the band in use. On this account, the image signal does not interfere with the band in use. Accordingly, without providing a bulky filter outside an integrated circuit, it becomes possible to prevent the image signal from interfering with the band in use.

Further, according to the present invention, because the relation $f_{LO2}=f_{LO1}/m$ (m is an arbitrary number satisfying: m>1) is satisfied, the second local oscillation signals can be generated by dividing the frequency of the first local oscillation signal. As such, the generation of the first local oscillation signal and the second oscillation signals can be carried out by only a single phase-locked loop circuit. On this account, the frequency conversion circuit can have a simple structure. Accordingly, the frequency conversion circuit can be incorporated into an integrated circuit, and can have a small size.

Further, in the present invention, the second stage downconversion is carried out by using the second local oscillation signals having the phases of 0° and 270°, respectively, corresponding to the second local oscillation signals having phases of 0° and 90° in which only a quadrature signal is inverted. On this account, when extracting a component, having a frequency higher than the frequency of the radio frequency carrier wave which is included in a side band, as a base-band signal, a counterclockwise voltage vector (i.e., a rotation direction heading from I (0°) to Q (270°)) is obtained. This allows normal modulation of the component having such a frequency higher than the frequency of the radio frequency carrier wave which is included in the side band.

Further, according to the frequency conversion circuit, when $m=2^n$ is satisfied where m is an integer and n is a positive integer, it is possible to generate the second local oscillation signals more easily with the use of a digital circuit which divides the frequency of the first local oscillation signal.

Further, according to the frequency conversion circuit of the present invention, when further including an image signal removal filter for removing the image signal from the output signal of the first mixer, it is possible that the first mixer causes the image signal to shift toward a high frequency. This allows the image signal removal filter to remove the image signal with ease. Further, when using an LC filter as the image signal removal filter, it is possible that, in the LC filter, a coil has small inductance, and a capacitor has small capacitance. Accordingly, the LC filter can have a small size, and can be mounted in an integrated circuit.

Further, when the frequency conversion circuit of the present invention further includes (i) an oscillator for generating the first oscillation signal, and (ii) a divider for dividing the frequency of the first local oscillation signal into 1/m so that the divider generates the second local oscillation signals having the phases of 0° and 270°, respectively, a local oscillation signal generation section can be incorporated in the integrated circuit. With the arrangement, it is possible that the arrangement is realized by a digital circuit. Specifically, the divider can be realized by a digital dividing circuit for dividing the frequency $f_{LO1}$ of the first local oscillation signal by m so that the second local oscillation signals having the frequency $f_{LO2}$ is generated.

Further, when the radio frequency transceiver of the present invention further includes: (i) an oscillator for generating the first local oscillation signal; (ii) a divider for dividing the frequency of the first local oscillation signal into 1/m so as to generate the second local oscillation signals having phases 0° and 270°, respectively; (iii) a fifth mixer for mixing the first local oscillation signal generated by the oscillator with the second local oscillation signal, having the phase of 0°, generated by the divider so as to generate a clock signal having the frequency $f_{RF}$ and a phase of 0°; and (iv) a sixth mixer for mixing the first local oscillation signal generated by the oscillator with the second local oscillation signal, having the phase of 270°, generated by the divider so as to generate a clock signal having the frequency $f_{RF}$ and a phase of 90°, it is possible for a single oscillator to generate both two kinds of local oscillation signals for downconversion, and clock signals for upconversion. This allows integration and downsizing of the constituent circuits to be realized.

Further, when the radio frequency transceiver of the present invention further includes: a signal generator for generating the first local oscillation signal and the second local oscillation signals, and for sending the first and the second local oscillation signals to the frequency conversion circuit provided in the radio frequency receiver, wherein: the signal generator generates clock signals (radio frequency signals having the frequency $f_{RF}$) used for the upconversion in the radio frequency transmitter, and sends the clock signals to the radio frequency transmitter, it is possible to realize, by a single circuit, a circuit for generating the clock signals (local oscillation signals) for downconversion and a circuit for generating the clock signals for upconversion. This allows further integration and downsizing of the constituent circuits to be realized.

When the radio frequency transceiver of the present invention further includes: (i) an antenna for receiving the radio frequency carrier wave, the antenna being so designed as to operate efficiently at the desired frequency; and (ii) switching means for switching between (a) a receiving mode in which the switching means connects the antenna to the radio frequency receiver and (b) a transmitting mode in which the switching means connects the antenna to the radio frequency transmitter, circuit components, for generating the clock signals, in the signal generator stopping operating during the receiving mode, it is possible to reduce the power consumption and the occurrence of noise. This is because the circuit components, for generating the clock signals, in the signal generator stop operating during the receiving mode.

Note that so called antenna switches per se, which are disclosed in the patent document 1 (indicated by a reference numeral "102") and the non-patent document 2, for switching between the receiving mode and the transmitting mode do not reduce the power consumption.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 9(a) shows a case (comparative example) of using a local oscillation signal having a frequency lower than that of a radio frequency carrier wave, and FIG. 9(b) shows a case of using a local oscillation signal having a frequency higher than that of a radio frequency carrier wave.

DESCRIPTION OF THE EMBODIMENTS

Figure 1:
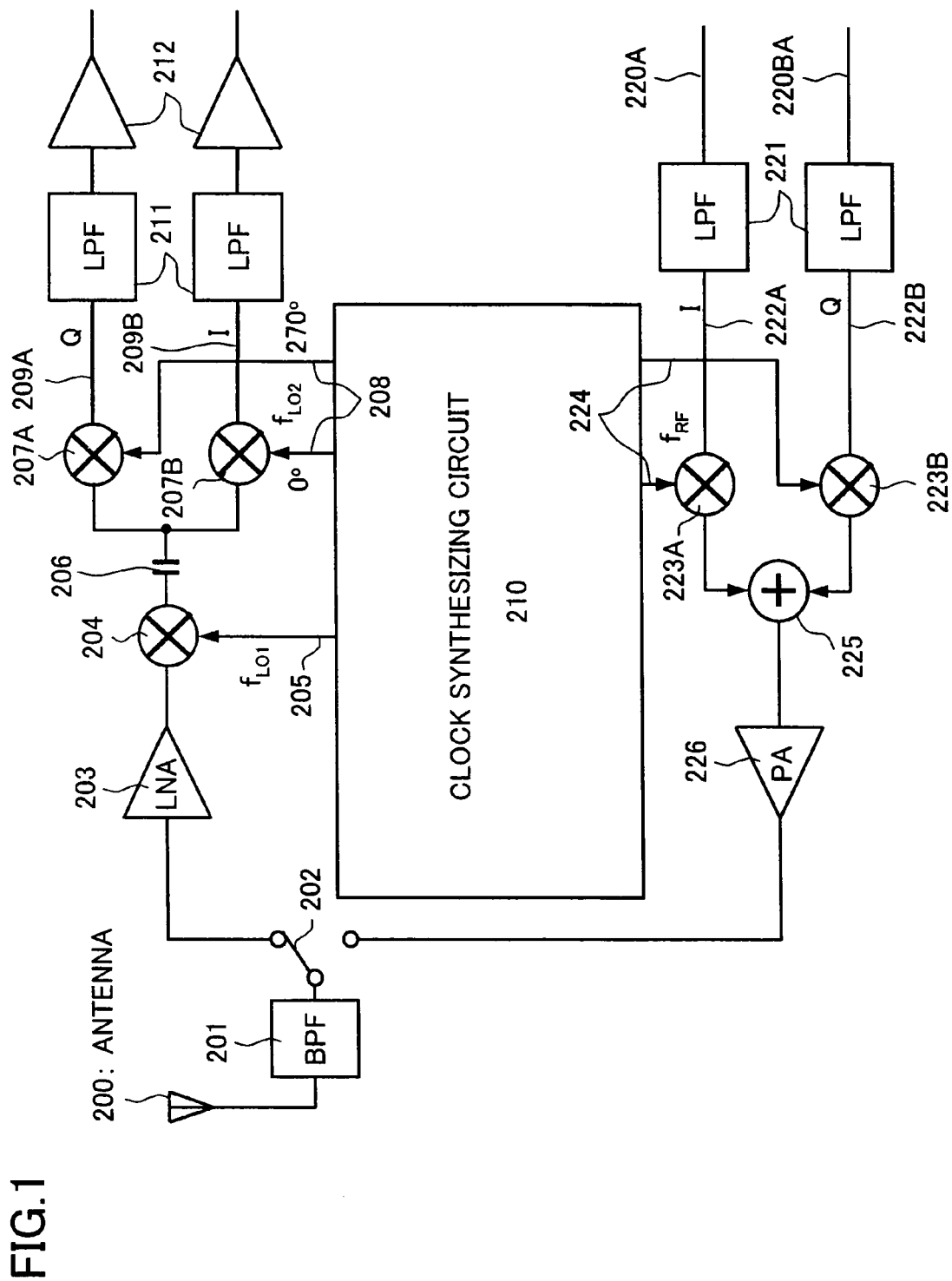
FIG. 1 is a block diagram illustrating a structure of a transceiver of an embodiment in accordance with the present invention.

The present invention relates to an analog signal processing section of an IC-chipped transceiver (radio frequency transceiver) that is used in a wireless communication system using a radio frequency of 1 GHz or greater. The wireless communication system is applicable to (i) a mobile communication system such as a mobile phone or a PHS (personal handyphone system), (ii) a wireless LAN (local area network) which is compliant with the IEEE 802.11 standard, or the like.

In a transceiver of the best mode for carrying out the present invention, radio frequency modulation (transmitting) and radio frequency demodulation (receiving) are carried out with respect to a base-band signal. The feature of the present transceiver resides in how the radio frequency modulation and radio frequency demodulation are carried out. An object of the present invention is to downsize the transceiver so that the function of the transceiver is incorporated in an IC chip, and the IC chip is mounted in a mobile phone.

In a receiving section of the transceiver in accordance with the best mode, two-stage frequency conversion is carried out. Specifically, an antenna of the transceiver receives a radio frequency signal, and then the radio frequency signal is amplified. The radio frequency signal thus amplified is mixed, by a first mixer, with a first local oscillation signal. The signal thus mixed is sent to a second mixer, and is mixed, by the second mixer, with two kinds of quadrature signals (second local oscillation signals) having different phases, respectively. On this account, obtained are two quadrature signals having different frequencies. Analog/digital conversions are carried out with respect to the two quadrature signals. The two quadrature signals thus converted are transmitted to a digital processing section.

Further, for the purpose of downsizing, the transceiver of the best mode proceeds as follows. More specifically, the first local oscillation signal is generated by carrying out a local oscillation at a frequency higher than the frequency of the radio frequency signal with the use of a phase-locked loop circuit. The first local oscillation signal is divided into two first quadrature signals (second oscillation signals) having different phases of 0° and 270°, respectively.

Meanwhile, in a transmitting section of the best mode, a first stage frequency conversion (direct conversion) is carried out. Specifically, a digital/analog conversion is carried out with respect to a digital signal outputted from the digital processing section so as to obtain two quadrature signals. The two quadrature signals thus obtained are mixed, by mixers, with two second quadrature signals having frequencies different from those of the first quadrature signals, respectively. The signals thus mixed are combined into a signal, and the signal is amplified and transmitted via the antenna. Note that the two second quadrature signals, having frequencies different from those of the first quadrature signals, respectively, are generated by mixing each of the two first quadrature signals, which is obtained by the division, with the first local oscillation signal.

As described above, the feature of the transceiver of the best mode resides in the circuit structure, (i) which is designed with the integration and the downsizing in mind, and (ii) which is different from the conventional transceivers. Specifically, the integration and downsizing is an object of the transceiver of the best mode, and a feature of transceiver resides in that (i) the frequency of the first local oscillation signal, which is used by the first mixer of the receiving section, is divided so as to obtain the two signals having different phases, and the two signals are used by the second mixer of the receiving section, and (ii) each of the two signals is mixed with the first oscillation signal so that two quadrature signals having frequencies different from those of the two signals are obtained, and the two quadrature signals are used by the mixer of the transmitting section.

The integration and the downsizing is an object of the transceiver of the best mode, and another feature of transceiver resides in that the frequency of the local oscillation signal is so set that the mixing of the local oscillation signal with an image signal (false signal) allows the image signal to have a frequency higher than the local oscillation signal.

Generally, in a transceiver, a local oscillation signal and a radio frequency signal are mixed so as to carry out frequency conversion. However, the mixing inevitably causes generation of both a signal having a target frequency, and a signal (image signal) having a false frequency (image frequency).

In the present invention, the frequency of the local oscillation signal is set higher than the frequency of the radio frequency signal (target signal). This causes the image signal to have a very high frequency. On this account, the image signal can be easily reduced by frequency characteristics that circuit components such as a transistor intrinsically have. Therefore, the transceiver can be realized in the form of an IC chip. Further, even if the transceiver IC chip further includes a filter, in addition to the circuit components such as a transistor, so as to remove the image signal, the filter can have smaller number of components such as a coil, a capacitor, and the like. As such, it is possible to downsize the filter. This causes the filter to occupy a smaller area in the transceiver IC chip, thereby allowing the size of the entire transceiver IC chip to be reduced.

The present invention is to provide a new transceiver that can be easily mounted into an integrated circuit, and that is applicable to a half-duplex transceiver. The following description deals with a transceiver of the best mode for carrying out the present invention with reference to drawings. FIG. 1 is a block diagram illustrating the transceiver of the best mode.

The transceiver of the present best mode has the following main features (a) through (c):

(a) For a downconversion of receiving-use, adopted is a dual conversion system in which a first mixer 204 uses a local oscillation signal, having a frequency $f_{LO1}$ that is higher than a frequency $f_{RF}$ of a radio frequency carrier wave. The use of the local oscillation signal, having a frequency higher than a radio frequency signal, causes a frequency $f_{IM}$ of an image signal to shift toward a high frequency. When the frequency $f_{LO1}$ of the local oscillation signal is higher than the frequency $f_{RF}$ of the radio frequency carrier wave (i.e., $f_{LO1} > f_{RF}$), the frequency $f_{IM}$ of the image signal satisfies the following relations: $f_{IM} = 2f_{LO1} - f_{RF}$, and $f_{IM} > f_{RF}$. Therefore, by adequately selecting the frequency $f_{LO1}$ of the local oscillation signal, it is possible to shift the frequency $f_{IM}$ of the image signal outside a bandwidth of a receiver in a frequency spectral region. The image signal thus shifted has energy that does not affect adversely an operation of the transceiver;

(b) The shift of the frequency $f_{IM}$ of the image signal to the higher frequency than the frequency $f_{RF}$ of the radio frequency carrier wave ensures a very easy removal of the image signal by filtering the image signal with the use of a small filter in the integration circuit; and (c) A clock synthesizing circuit 210, which is used in a receiving channel, is also used to upconvert a frequency of a transmitter signal into a frequency of the radio frequency carrier wave, based on the direct conversion system.

The following description explains main blocks of the present transceiver, and operations of the present transceiver with reference to FIG. 1. Specifically, described here is the case where the present invention is applied to a half-duplex transceiver which is compliant with the WLAN IEEE 802.11b standard.

The present transceiver (radio frequency transceiver) includes (i) an antenna 200 for receiving and transmitting a radio frequency carrier wave, (ii) a radio frequency band pass filter 201, (iii) a receiving channel (radio frequency receiver) for receiving a radio frequency signal from the antenna 200, (iv) a transmitting channel (radio frequency transmitter) for transmitting a radio frequency signal to the antenna 200, and (v) a switch 202.

The antenna 200 receives a radio frequency carrier wave having a frequency range of 2412 MHz to 2484 MHz. Such a frequency varies depending on which channel is selected. The antenna 200 is so designed that the antenna 200 efficiently operates at a frequency of a desired radio frequency carrier wave. The radio frequency band-pass filter 201 limits a bandwidth of a radio frequency signal that is sent from the antenna 200 toward the receiving channel, or that is sent from the transmitting channel toward the antenna 200. Specifically, when the radio frequency band-pass filter 201 receives the radio frequency signal, it allows a band, including the frequency of the radio frequency carrier wave which is to be extracted, to pass through. The switch 202 selects which channel (the receiving channel via a low noise amplifier (LNA) 203, or the transmitting channel via a power amplifier (PA) 226) is to be connected to the antenna 200. Namely, the switch 202 functions as switching means for switching between a receiving mode and a transmitting mode. In the receiving mode, the switch 202 connects the antenna 200 to the receiving channel, whereas in the transmitting mode, the switch 202 connects the antenna 200 to the transmitting channel. The arrangement is similar to the conventional transceivers.

The present transceiver further includes a clock synthesizing circuit (signal generator) 210 for (i) generating clock signals (local oscillation signal) for frequency conversions in the receiving channel and the transmitting channel, respectively, and for (ii) supplying the clock signals to the receiving channel and the transmitting channel, respectively. The clock synthesizing circuit 210 generates two clock signals 224, having a frequency $f_{RF}$ of the radio frequency carrier wave, for frequency conversion in the transmitting channel. The two clock signals 224 have the same frequency and the same amplitude, whereas have different phases with a phase difference of 90°.

In the receiving channel, a two-stage downconversion is carried out with respect to a radio frequency signal having a desired frequency. The receiving channel includes (i) the low noise amplifier 203, (ii) a first mixer 204 for carrying out the first stage downconversion, (iii) a capacitor 206, (iv) a Q mixer 207A and an I mixer 207B (each serving as a second mixer) for carrying out the second stage downconversion with the use of two second local oscillation signals 208, (v) low-pass filters 211, and (vi) amplifiers 212. Of these circuit components, the first mixer 204, the capacitor 206, the Q mixer 207A, and the I mixer 207B constitute a frequency conversion circuit.

The low noise amplifier 203 amplifies the radio frequency signal which has passed through the radio frequency band-pass filter 201, and attenuates the image signal interfering with the band of the radio frequency signal to such a degree that the image signal substantially vanishes. The first mixer 204 mixes the radio frequency signal with the first local oscillation signal so that the radio frequency signal is downconverted into an intermediate frequency signal having a frequency lower than the radio frequency signal. The low noise amplifier 203 may include an image signal removal filter for removing the image signal from an output signal of the first mixer 204. It is preferable that the image signal removal filter reduces, by 10 dB or greater, the image signal for the frequency $f_{IM}$ ($f_{IM}=2f_{LO1}-f_{RF}$) and for a frequency higher than the frequency $f_{IM}$. The image signal removal filter can be realized by an LC filter in an IC chip having a small size. Note that image signal removal filters may be provided between the first mixer 204 and the Q mixer 207A, and between the first mixer 204 and the I mixer 207B, respectively.

The Q mixer 207A and the I mixer 207B downconvert the intermediate signal into base-band signals 209A and 209B that have frequencies lower than the frequency of the intermediate signal, and that have different phases, respectively. Note that the intermediate signal is sent from the first mixer 204, via the capacitor 206, to the Q mixer 207A and the I mixer 207B, respectively. Specifically, the Q mixer 207A mixes the intermediate signal with the second local oscillation signal 208 having a phase of 270° so that the intermediate signal is downconverted into the base-band signal 209A (Q signal) having a phase of 90°. The I mixer 207B mixes the intermediate signal with the second local oscillation signal 208 having a phase of 0° so that the intermediate signal is downconverted into the base-band signal 209B (I signal) having a phase of 0°.

The low-pass filters 211 carries out low-pass filtering with respect to the base-band signals 209A and 209B (i.e., in-phase signal and quadrature signal of base band) that have different phases, and that have been generated by the Q mixer 207A and the I mixer 207B, respectively. The amplifiers 212 amplify the base-band signals filtered by the low-pass filter 211.

Meanwhile, the transmitting channel receives an in-phase component (I) 220A and a quadrature component (Q) 220B of base-band signals which are obtained by an analog conversion with respect to a digital signal that is to be transmitted. The transmitting channel includes low-pass filters 221, a quadrature modulator, and a power amplifier 226. The low-pass filters 221 limit bandwidths of the in-phase component and the quadrature component of the base-band signals, respectively. The quadrature modulator directly upconverts in-phase component (I signal) 222A and a quadrature component (Q signal) 222B of base-band signals into a radio frequency signal having the frequency $f_{RF}$. The power amplifier 226 amplifies electric power of the radio frequency signal which is obtained via the upconversion carried out by the quadrature modulator. The quadrature modulator includes (i) an I/Q mixer 223A (third mixer) for mixing the in-phase component 222A of the base-band signal with the clock signal 224 having the frequency $f_{RF}$, and having a phase of 0°; (ii) an I/Q mixer 223B (fourth mixer) for mixing the quadrature component 222B of the base-band signal with the clock signal 224 having the frequency $f_{RF}$, and having a phase of 90°; and (iii) an adder 225 for adding an output signal of the I/Q mixer 223A and an output signal of the I/Q mixer 223B.

Incidentally, the frequency $f_{LO1}$ of the first local oscillation signal (clock signal) 205 used by the first mixer 204 has such a relation with the frequency $f_{RF}$ of the radio frequency carrier wave as to satisfy $f_{LO1}=k \times f_{RF}$ (k>1), the first local oscillation signal 205 being sent from the local oscillator in the clock synthesizing circuit 210. k is typically in a range of 1.125 to 1.35. The two second local oscillation signals 208 which are used by the Q mixer 207A and the I mixer 207B, respectively, have the frequency $f_{LO2}$, and have different phases of 0° and 270°, respectively. The frequency $f_{LO2}$ has such a relation with the frequency $f_{LO1}$ as to satisfy:

$$f_{LO2}=f_{LO1}/m$$

where m is larger than 1 (preferably, is an integer of 2 or more). k and m satisfy the following relation:

$$k=m/(m-1), m>1.$$

Note that the frequency $f_{LO2}$ changes according to the frequency $f_{LO1}$.

Because of the following advantages (1) and (2), the first local oscillation signal, having the frequency $f_{LO1}$ higher than the frequency $f_{RF}$ of the radio frequency carrier wave, is used in the first mixer 204.

(1) In cases where the image signal has a high frequency of, for example, approximately 4 GHz, the image signal having such a high frequency does not interfere with a WLAN system in an ordinary use. A wireless communication system which is not free from the interference from the image signal is a point-to-point microwave connection system, or a radio-locator system, but not with a WLAN system.

(2) The image signal can be removed by filtering the output signal of the first mixer 204 at a high frequency (cut-off frequency) with the use of the small LC filter that is provided on the IC chip.

The following description deals with an operation of the transceiver.

Firstly, a receiving operation is explained. A radio frequency signal having the frequency $f_{RF}$ is supplied to the receiving channel from the antenna 200, via the switch 202. The radio frequency signal is amplified by the low noise amplifier 203. The signal thus amplified is downconverted, by the first mixer 204, into a signal (intermediate signal) having the frequency $f_1$ ($f_1=f_{LO1}-f_{RF}$), and the intermediate signal is outputted from the first mixer 204.

The intermediate signal thus outputted from the first mixer 204 is mixed, by the Q mixer 207A, with the clock signal (quadrature signal Q) 208 having the frequency $f_{LO2}$, and having the phase of 270°. Also, the intermediate signal outputted from the first mixer 204 is mixed, by the I mixer 207B, with the clock signal (signal I) 208 having the phase of 0°. The frequency $f_{LO2}$ of the clock signals 208 is equal to the center frequency $f_1$ of the intermediate frequency signal. This allows the output signals of the Q mixer 207A and the I mixers 207B to have base-band signal components, respectively.

The base-band signal 209A (VQP and VQN) of the Q mixer 207A, and the base-band signal 209B (VIP and VIN) of the I mixer 207B are sent to the low-pass filters 211, respectively. The base-band signals thus filtered are amplified by the amplifiers 212, respectively. If an analog/digital conversion is carried out with respect to the base-band signals, then the received signal is ready to complete a reproduction.

Next, a transmitting operation of the transceiver is explained.

During the transmitting mode, operation of the circuits in the receiving channel is stopped to save the power consumption. The base-band signals that have been converted into analog signals of composite I/Q type, i.e., the in-phase component 220A and the quadrature component 220B of the base-band signals are sent to the low-pass filters 221, respectively. This allows the band width of the transmitter signal to be limited in accordance with a rule established by a transmission standard. The in-phase component 222A and the quadrature component 222B thus filtered are sent to the I/Q mixers 223A and 223B, respectively, so as to be mixed with the clock signals having the frequency $f_{RF}$ of the radio frequency signal, respectively. Then, output signals of the I/Q mixers 223A and 223B are added by the adder 225. The signal thus added is amplified by the power amplifier 226, and the signal thus amplified is transmitted via the antenna 200.

Here, it is preferable that m is an integer which satisfies the relation: $m=2^n$ (n is a positive integer). Table 1 shows (i) four possible combinations of m and k (i.e., $m=2^1, 2^2, 2^3,$ and $2^4$), and (ii) frequency $f_{LO1}$ and frequency $f_{LO2}$ used in each of the combinations, when the frequency $f_{RF}$ of the radio frequency carrier wave is 2400 MHz, (iii) possible frequency $f_{IM}$ of the image signal in each of the combinations, and (iv) difference $\Delta IM$ between the frequency $f_{RF}$ of the radio frequency carrier wave and the frequency $f_{IM}$ of the image signal.

TABLE 1

| m | k | $f_{LO1}$ [MHz] | $f_{LO2}$ [MHz] | $f_{IM}$ [MHz] | $\Delta IM = f_{RF} - f_{IM}$ [MHz] |
|---|---|---|---|---|---|
| 2 | 2.000 | 4800.00 | 2400.00 | 7200.00 | 4800.00 |
| 4 | 1.333 | 3200.00 | 800.00 | 4000.00 | 1600.00 |
| 8 | 1.143 | 2742.86 | 342.86 | 3085.71 | 685.71 |
| 16 | 1.067 | 2560.00 | 160.00 | 2720.00 | 320.00 |

As shown in Table 1, for example, in the case where m is 4, k is 4/3, and the frequency $f_{LO1}$ is 3200 MHz, the image signal has a frequency $f_{IM}$ of 4000 MHz. Thus, the frequency $f_{IM}$ of the image signal is 1600 MHz away from the frequency $f_{RF}$ of the radio frequency signal.

Figure 3A:
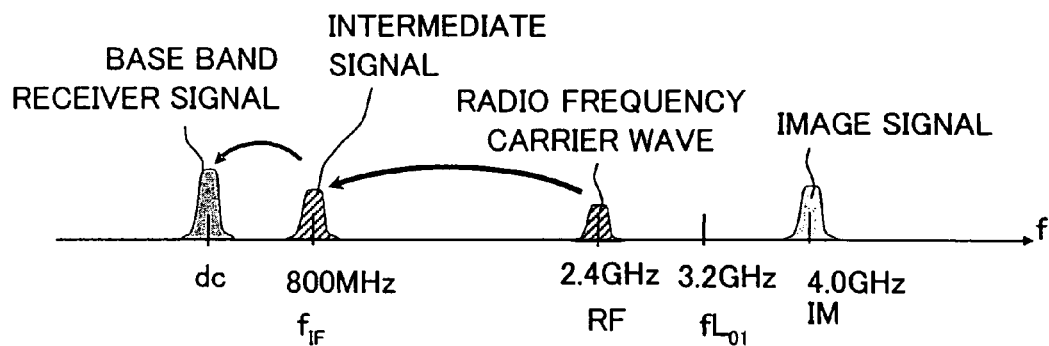
FIG. 3(a) is a graph illustrating a change in signal frequency spectrums caused by a downconversion in a receiving channel of the transceiver.
Figure 3B:
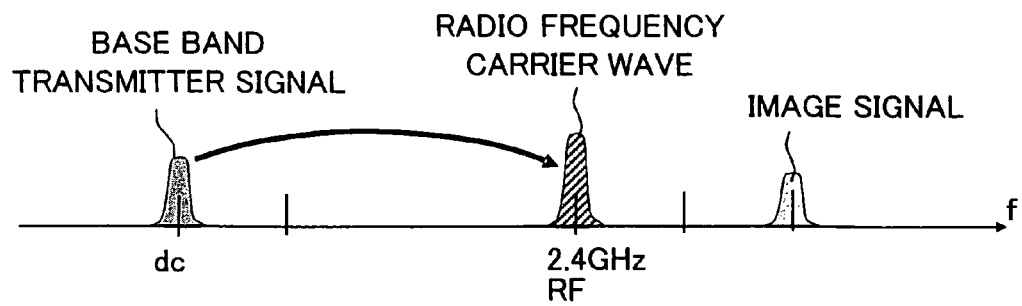
FIG. 3(b) is a graph illustrating a change in signal frequency spectrums caused by an upconversion in a transmitting channel of the transceiver.

FIG. 3(a) illustrates a change in signal frequency spectrums caused by the downconversion in the receiving channel of the present transistor when satisfying m=4, k=4/3, and $f_{LO1}$=3200 MHz. FIG. 3(b) illustrates a change in signal frequency spectrums caused by the upconversion in the transmitting channel of the present transistor when satisfying m=4, k=4/3, and $f_{LO1}$=3200 MHz.

Figure 2:
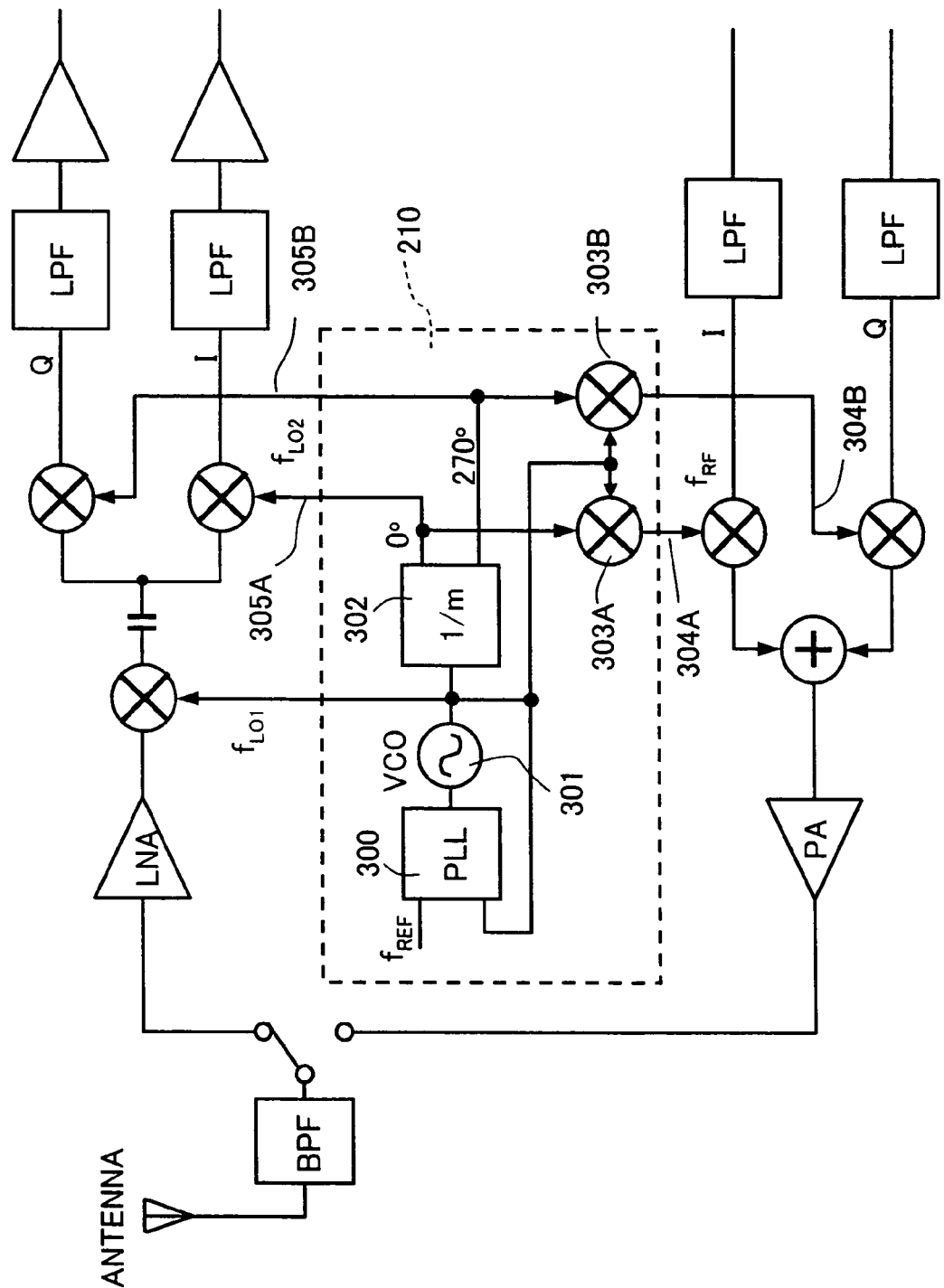
FIG. 2 is a block diagram illustrating a structure of a clock synthesizing circuit in the transceiver.

FIG. 2 illustrates a circuitry of the clock synthesizing circuit 210 of the transceiver shown in FIG. 1.

As shown in FIG. 2, the clock synthesizing circuit 210 includes a voltage controlled oscillator (VCO) 301, and a phase-locked loop (PLL) circuit 300. The voltage controlled oscillator 301 oscillates at the frequency $f_{LO1}$ ($f_{LO1}=k \times f_{RF}$) so as to generate an output signal having the frequency $f_{LO1}$. The phase-locked loop circuit 300 stabilizes and controls the frequency of the output signal of the voltage controlled oscillator 301. The output signal of the voltage controlled oscillator 301 is supplied, as the first local oscillation signal 205, to the first mixer 204. The output signal of the voltage controlled oscillator 301 is also supplied to a later described mixer 303A (fifth mixer), and a later described mixer 303B (sixth mixer). The frequency of the output signal of the voltage controlled oscillator 301 is divided into 1/m by a divider circuit (divider) 302. The divider circuit 302 simultaneously generates (i) a signal 305A having the frequency $f_{LO2}$, and a phase of 0°, and (ii) a signal 305B having the frequency $f_{LO2}$, and a phase of 270°. The signals 305A and 305B are supplied to the Q mixer 207A and the I mixer 207B, as the second local oscillation signals 208, respectively. The signals 305A and 305B are also supplied to the mixers 303A and 303B, respectively.

The mixer (the fifth mixer) 303A mixes (i) the output signal (having the frequency $f_{LO1}$) of the voltage controlled oscillator 301 with (ii) the signal 305A having the frequency $f_{LO2}$, and having a phase of 0°. This allows the mixer 303A to generate and output a radio frequency signal 304A having the frequency $f_{RF}$ and a phase of 0° to the I/Q mixer 223A, as the clock signal 224. The mixer (the sixth mixer) 303B mixes (i) the output signal (having the frequency $f_{LO1}$) of the voltage controlled oscillator 301 with (ii) the signal 305B having the frequency $f_{LO2}$, and having a phase of 270°. This allows the mixer 303B to generate and output a radio frequency signal 304B having the frequency $f_{RF}$ and a phase of 90° to the I/Q mixer 223B, as the clock signal 224.

In order to save the power consumption and to reduce a noise caused by a switching device, while receiving (i.e., while the switch 202 causes the transceiver to be in the receiving mode), each operation of the mixers 303A and the 303B (circuit components for generating the radio frequency signals 304A and 304B) is suspended, and (i) a channel, for transmitting the radio frequency signal 304A, connecting from the mixer 303A to the I/Q mixer 223A, and (ii) a channel, for transmitting the radio frequency signal 304B, connecting from the mixer 303B to the I/Q mixer 223B are cut off.

FIG. 4 through FIG. 7 show examples of circuits of the present transceiver (front-end radio frequency transceiver).

The present invention realizes a transceiver system for a wireless communication. The transceiver system is intended to be realized by a standard integration circuit (IC) process using the CMOS (complementary metal oxide semiconductor) process technique, or the BiCMOS process technique.

The transceiver of the present invention can be realized by an integrated circuit process using a standard circuit technique. The present transceiver is realized by the CMOS (complementary metal oxide semiconductor) integrated circuit. However, the present transceiver may be realized by other integrated circuit such as a bipolar BiCMOS. Further, it is preferable in view of the efficiency in high-frequency operation (GHz level) that the transceiver is realized based on a process for a high-speed transistor-use which can realize (i) a capacitor having high area efficiency such as metal-insulator-metal (MIM), and/or (ii) a thick metal layer for a heating inductor on a chip. Note that the present transceiver is not limited to a specific one realized by an integrated circuit, but may be realized by a group of individual circuit components.

Figure 4:
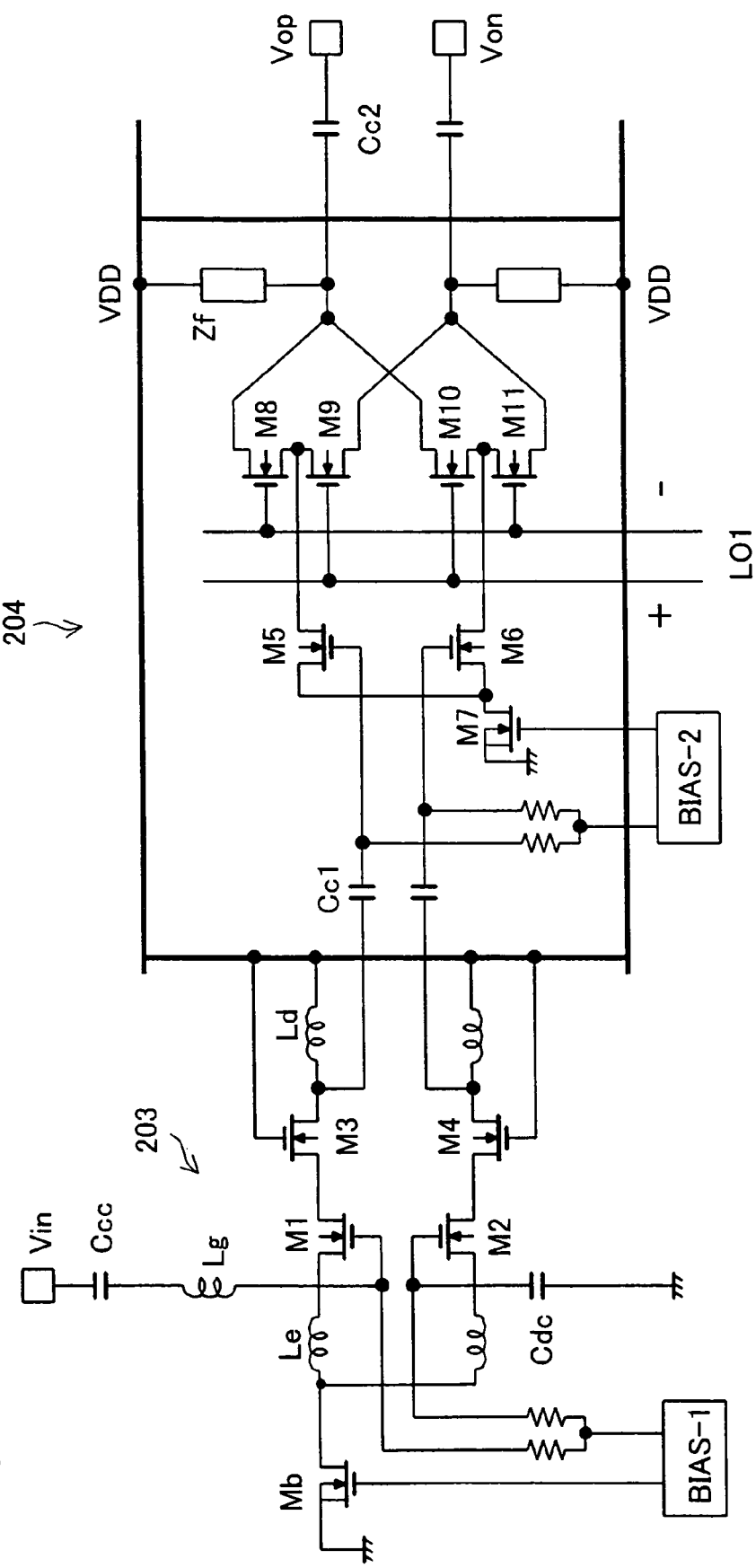
FIG. 4 is a circuit diagram showing examples of a low noise amplifier and a first mixer of the transceiver.

FIG. 4 shows an example of circuitry of the low noise amplifier 203 and the first mixer 204.

The low noise amplifier (LNA) 203 receives a signal which is supplied from the antenna 200 and the switch 202, via a pin Vin (input terminal). As shown in FIG. 4, transistors M1 through M4 constitute the low noise amplifier 203, which is loaded by a coil Ld (loading coil). The coil Ld, a capacitor Cc1, and an input impedance of next stage are adjusted so that the signal supplied via the pin Vin has a radio frequency of the carrier wave. A DC blocking capacitor, and inductors Lg and Le are used so that the input impedance is adjusted to 50Ω, and so that the noise factor in the low noise amplifier 203 is reduced.

As shown in FIG. 4, the first mixer 204 is a double-balanced Gilbert mixer which is well known to the person skilled in the art. As shown in FIG. 4, the first mixer 204 can be realized by differential transistors M5 and M6, switching quad transistors M8 through M11, and a current source transistor M7. The differential transistors M5 and M6 amplify the radio frequency signal sent from the low noise amplifier 203. The switching quad transistors M8 through M11 operate in synchronization with clock signals of the first local oscillation signal 205 having a clock of the frequency $f_{LO1}$. The first mixer 204 is loaded by an impedance element Zf, and is capacity-coupled with the next stage.

The signal mixing processing of the first mixer 204 causes another generation of a radio frequency signal having a frequency $f_2$ ($f_2=f_{RF}+f_{LO1}$; $f_2>f_{RF}$; $f_2>f_{LO1}$). However, the radio frequency signal having the frequency $f_2$ is affected by a frequency characteristic of the impedance element Zf. On this account, actually, only a differential signal having the frequency $f_1$ ($f_1=f_{LO1}-f_{RF}$) is sent from the first mixer 204 to the Q mixer 207A and the I mixer 207B. Note that, when the frequency $f_{LO1}$ of the first local oscillation signal 205 is 3200 MHz, the frequency f1 of the differential signal is 800 MHz.

Figure 5:
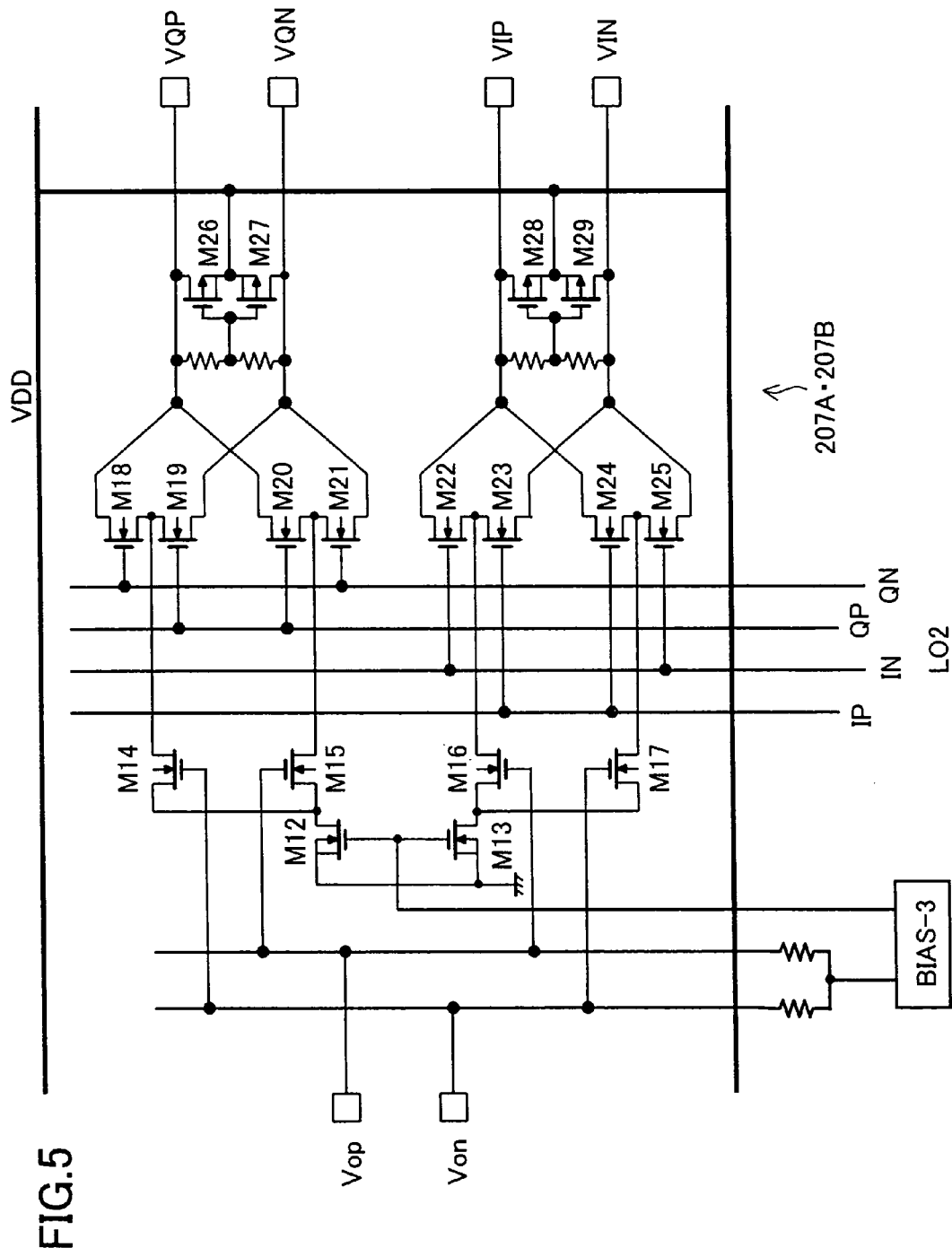
FIG. 5 is a circuit diagram showing examples of a Q and an I mixers of the transceiver.

FIG. 5 illustrates an example of circuitry of the differential I/Q mixers, i.e., the Q mixer 207A and the I mixer 207b.

The Q mixer 207A includes transistors (input differential transistor pair) M14 and M15; transistors (switching quad transistors) M18 through M21; and loads M26 and M27. The I mixer 207B includes transistors (input differential transistor pair) M16 and M17; transistors (switching quad transistors) M22 through M25; and loads M28 and M29. The input differential transistor pair M14 and M15, and the input differential transistor pair M16 and M17 receive the signals having the frequency $f_1$, i.e., a voltage Vop and a voltage Von, which are obtained by the downconversion and outputted from the first mixer 204.

Clocking is carried out with respect to the switching quad transistors M18 through M21 in response to quadrature signals Q (QN and QP; QP=−QN) having the frequency $f_{LO2}$ and a phase of 270°. Note that, in the present example, the frequency $f_{LO2}$ satisfies the relation: $f_{LO2}=f_{LO1}/4$. Similarly, clocking is carried out with respect to the switching quad transistors M22 through M25 in response to signals I (IN and IP; IP=−IN) having the frequency $f_{LO2}$ and a phase of 0°. The frequency $f_{LO2}$ is equal to the center frequency $f_1$ of the intermediate frequency signal that is sent to the Q mixer 207A and the I mixer 207B, respectively. This causes the output signals of the Q mixer 207A and the I mixer 207B to have base-band signal components, respectively.

Figure 6:
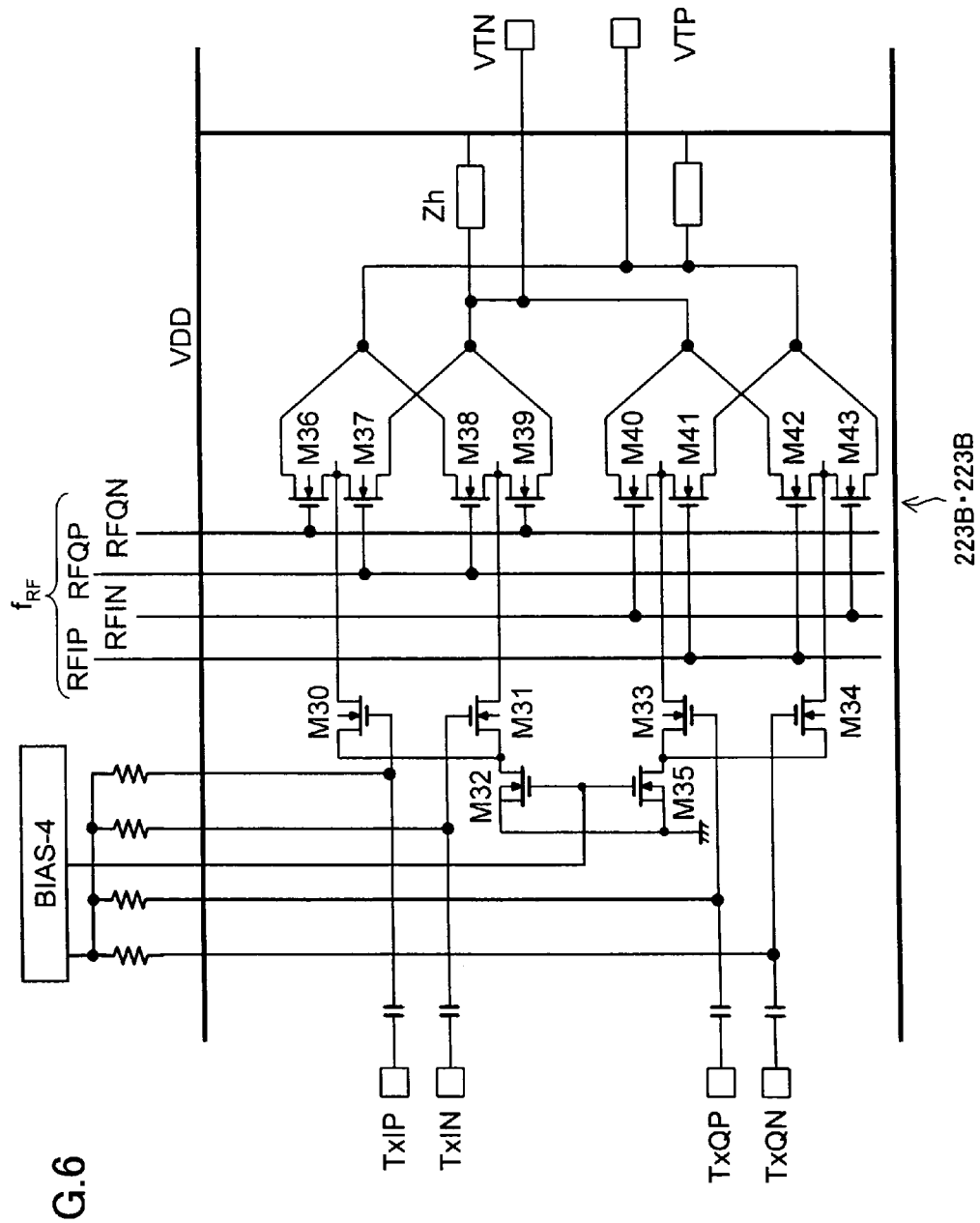
FIG. 6 is a circuit diagram showing an example of I/Q mixers for transmitting-use in the transceiver.

FIG. 6 illustrates circuitry of the I/Q mixers 223A and 223B for transmitting-use.

A Gilbert mixer is used as each of the I/Q mixers 223A and 223B. I signal 222A and Q signal 222B of the low-pass filters 221 are referred to as signals TxI (TxIP and TxIN) and TxQ (TxQP and TxQN), respectively. The signals TxI and TxQ are amplified by a differential transistor pair M30 and M31 and by a differential transistor pair M33 and M34 so as to be mixed by the quad transistors M36 through M39 and by the quad transistors M40 through M43, respectively. Output signals of the I/Q mixer 223A and 223B are combined (added) by the impedance element Zh (adder 225), and the signal thus combined is sent to the power amplifier 226.

Figure 7:
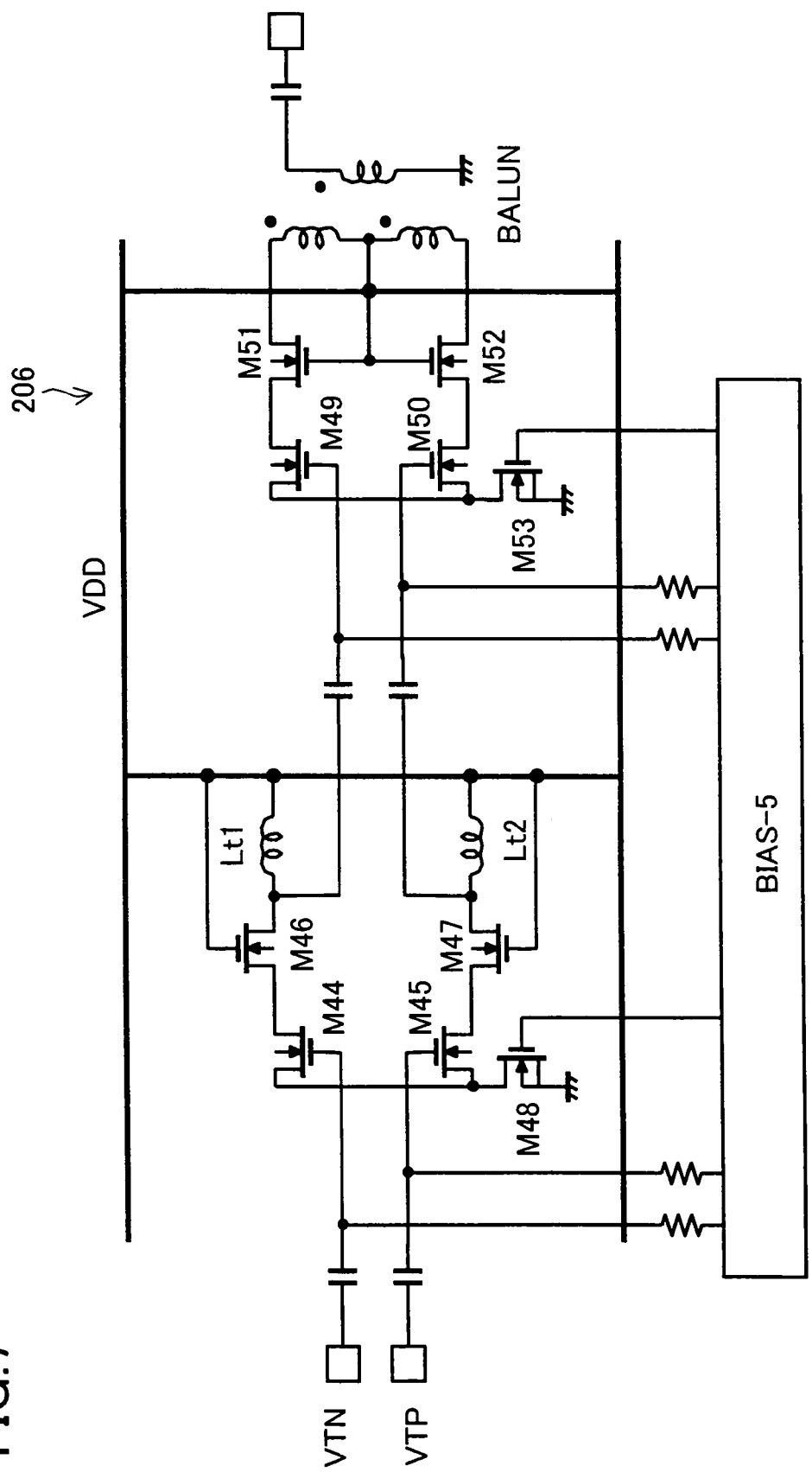
FIG. 7 is a circuit diagram showing an example of a power amplifier of the transceiver.

FIG. 7 illustrates an example of circuitry of the power amplifier 226.

In the example, the power amplifier 226 is realized by a cascade two-stage amplifier including first and second stage amplifiers. Differential signals VTN and VTP of the I/Q mixers 223A and 223B are amplified by transistors M44 through M48 of the first stage amplifier, and output signals of the first stage amplifier are amplified by transistors M49 through M53 of the second stage amplifier. The second stage amplifier further includes a balun load for converting the signals into a single-end signal, which drives the antenna 200.

Figure 8:
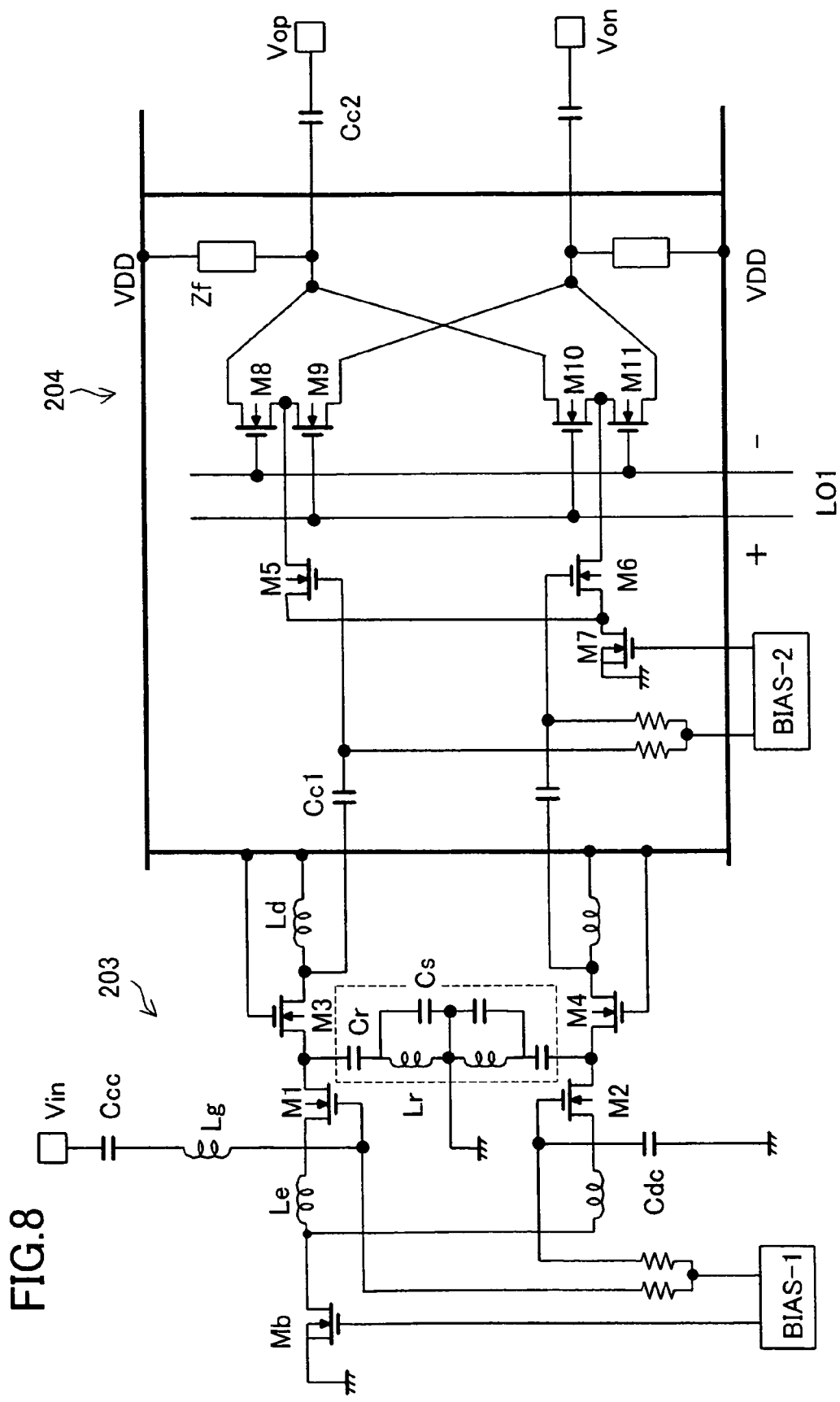
FIG. 8 is a circuit diagram showing another examples of the low noise amplifier and the first mixer.
Figure 9B:
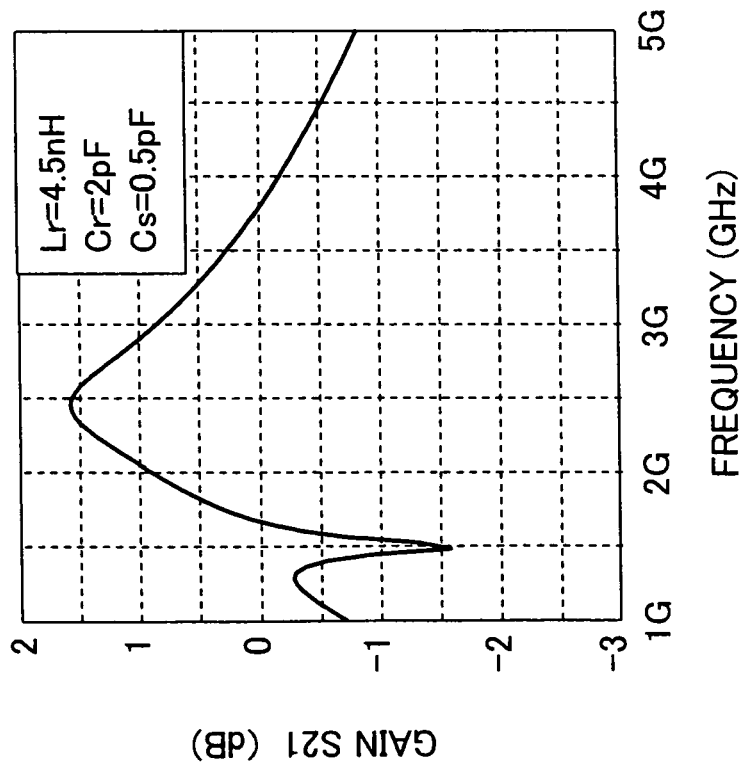
FIG. 9(a) and FIG. 9(b) are graphs illustrating a frequency dependency of gain of the low noise amplifier of FIG. 8. Specifically.
Figure 9A:
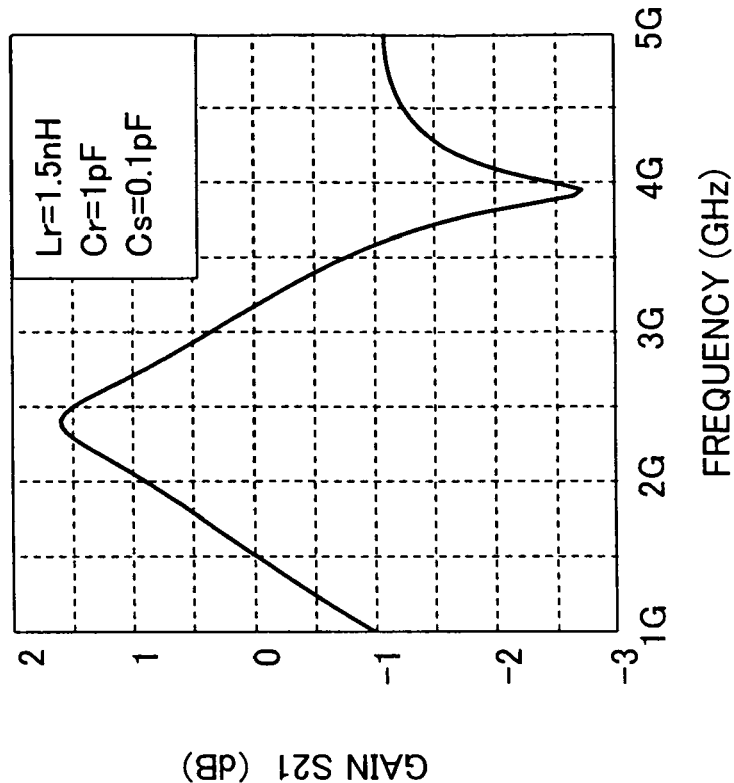
Figure 10:
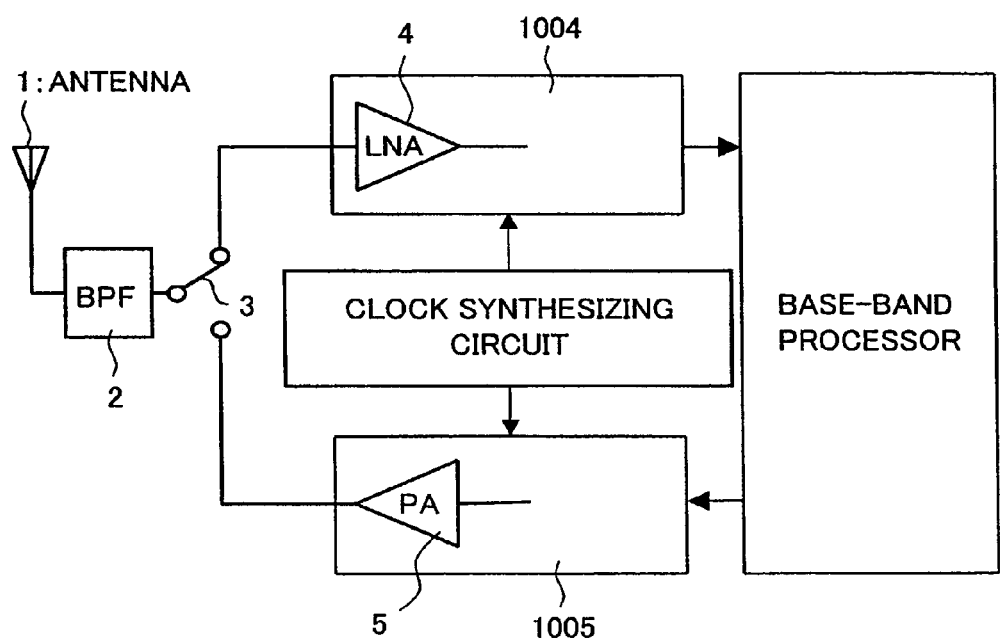
FIG. 10 is a block diagram illustrating a structure of a conventional and typical radio frequency receiver.
Figure 11:
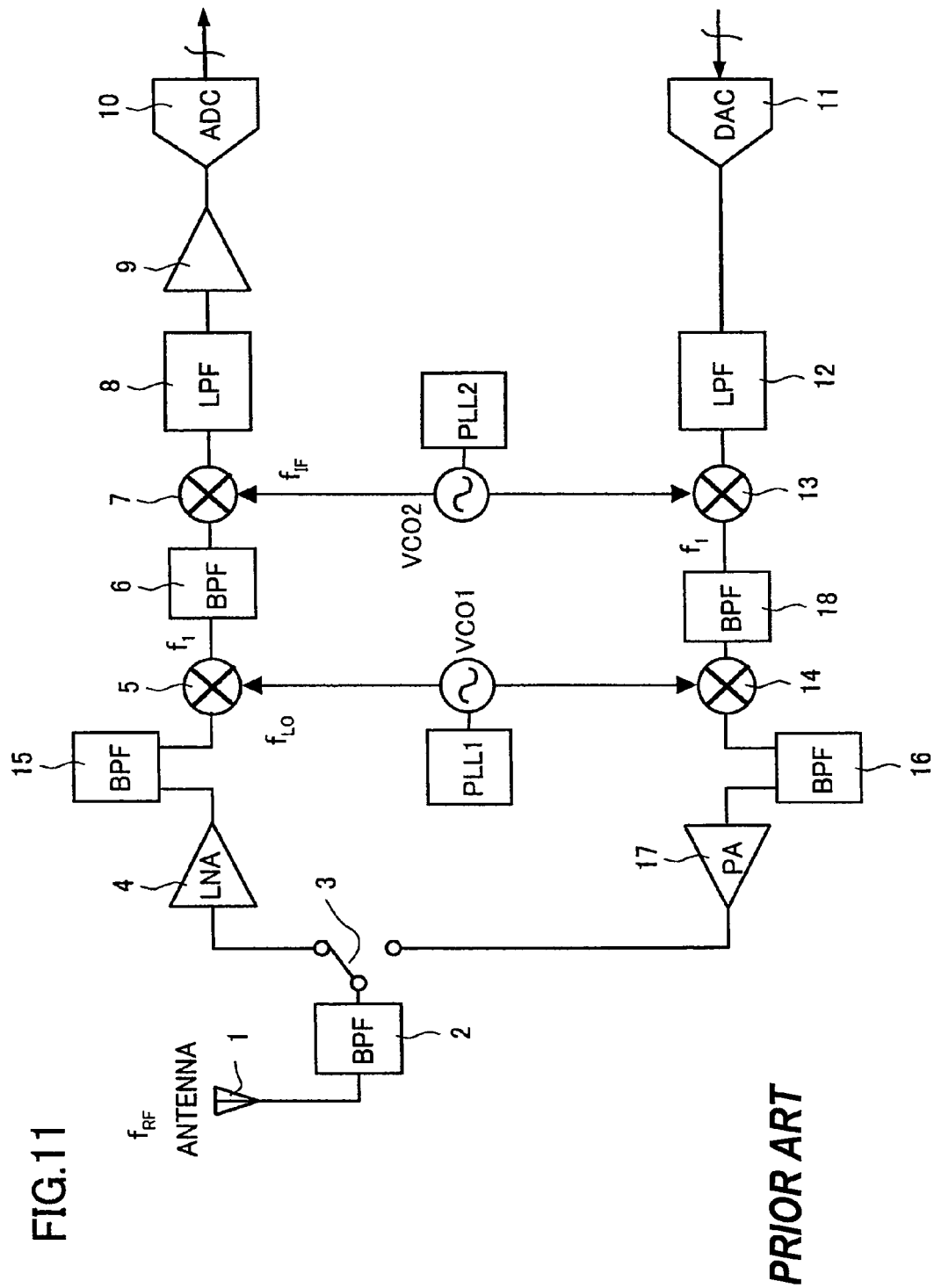
FIG. 11 is a block diagram illustrating a structure of a heterodyne (or super heterodyne) transceiver.
Figure 12:
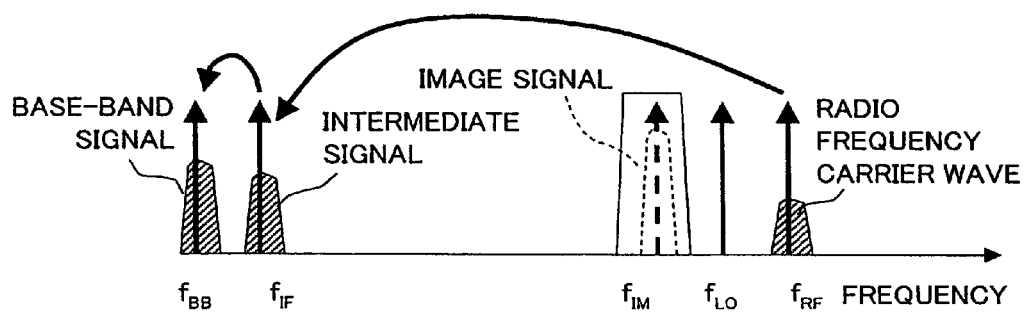
FIG. 12 is a graph illustrating a change in frequency spectrums caused by a downconversion in the heterodyne transceiver.
Figure 13:
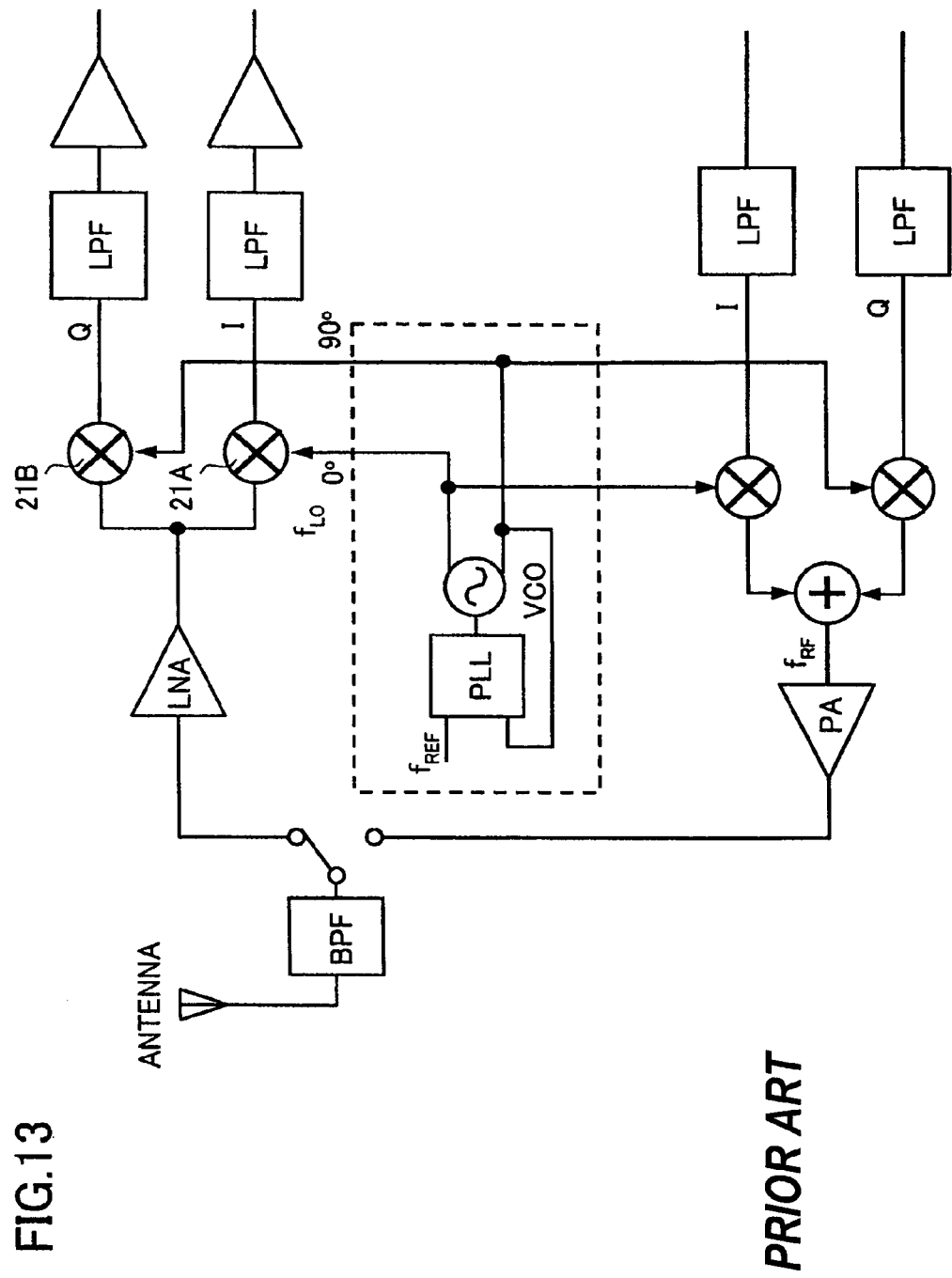
FIG. 13 is a block diagram illustrating a structure of a direct conversion transceiver.
Figure 14:
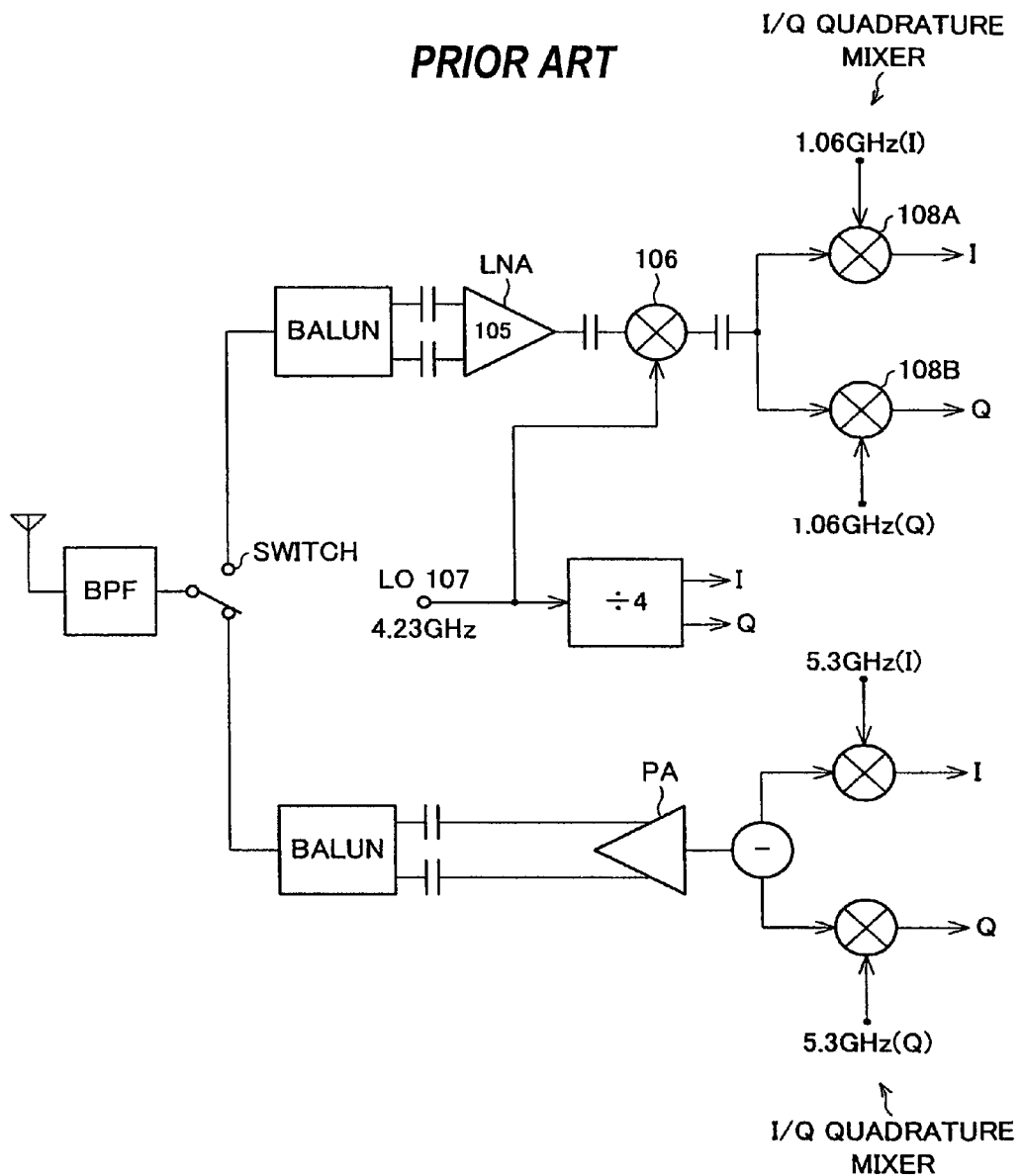
FIG. 14 is a block diagram illustrating a structure of a dual conversion transceiver disclosed in the patent document 1.
Figure 15:
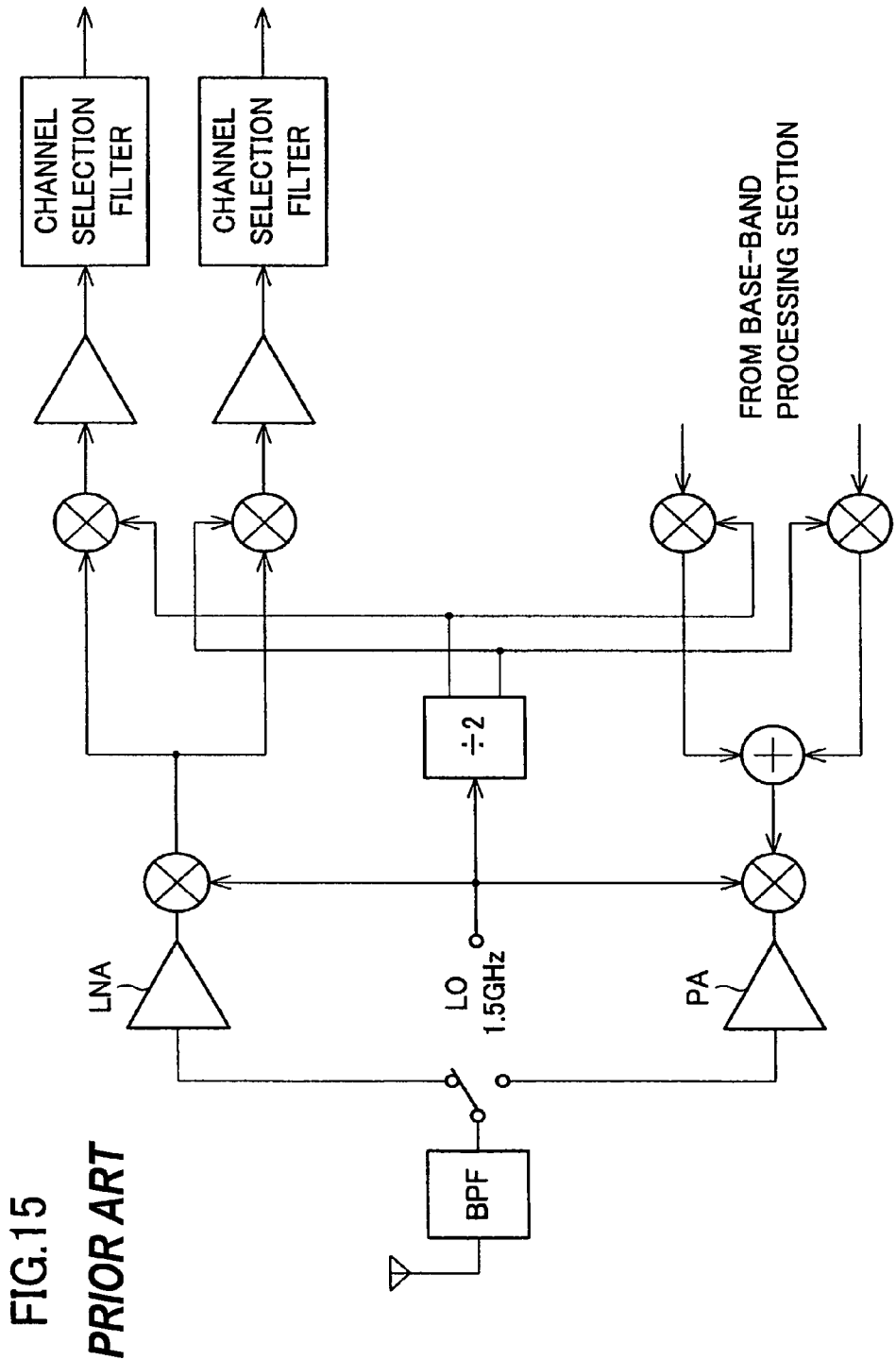
FIG. 15 is a block diagram illustrating a structure of a dual conversion transceiver disclosed in the non-patent document 2.
Figure 16:
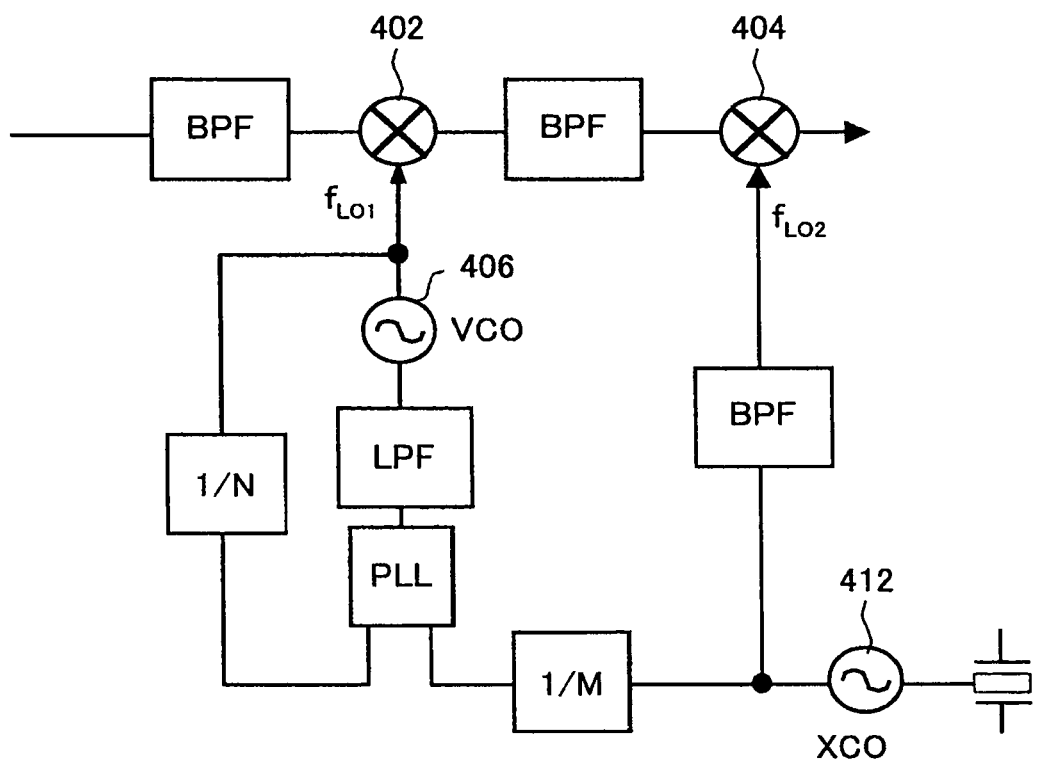
FIG. 16 is a block diagram illustrating a structure of a double conversion tuner disclosed in the patent document 2.

FIG. 8, FIG. 9(a), and FIG. 9(b) show an integration efficiency when using a local oscillation signal having the frequency $f_{LO1}$ higher than the frequency $f_{RF}$ of the radio frequency carrier wave (i.e., $f_{LO1}>f_{RF}$).

FIG. 8 illustrates another example of circuitry of a low noise amplifier 203 and the first mixer 204. Such a low noise amplifier 203 further includes an image trap filter (image signal removal filter) in addition to the low noise amplifier 203 shown in FIG. 4. Specifically, the image trap filter (notch filter) is provided between cathode nodes of the low noise amplifier 203 so as to reduce adverse effect of the image signal having the frequency $f_{IM}$. The image trap filter has very low impedance for the frequency $f_{IM}$. On this account, the image trap filter reduces that gain S21 of the low noise amplifier 203 at the image frequency $f_{IM}$. The image trap filter is realized by a resonance circuit made up of a coil Lr having inductance Lr, a capacitor Cr having capacitance Cr, a capacitor Cs having capacitance Cr. In the resonance circuit, the following relation is satisfied:

$$f_{IM} \approx 1/\{2(LrCr)^{1/2}\}$$

Note that the low noise amplifier 203 of FIG. 8 is so adjusted as to operate at the frequency $f_{RF}$ of 2.4 GHz.

FIG. 9(a) and FIG. 9(b) are graphs illustrating two different frequency dependency of gain in the low noise amplifier 203 shown in FIG. 8. Specifically, FIG. 9(a) illustrates a case (comparative example) of satisfying $f_{IM}$=1.5 GHz while using the local oscillation signal having the frequency $f_{LO1}$ lower than the frequency $f_{RF}$ of the radio frequency carrier wave (i.e., $f_{LO1}<f_{RF}$). FIG. 9(b) illustrates a case of satisfying $f_{IM}$=4 GHz while using the local oscillation signal having the frequency $f_{LO1}$ higher than the frequency $f_{RF}$ of the radio frequency carrier wave (i.e., $f_{LO1}>f_{RF}$).

The image trap filter reduces, by 20 dB or more, the image signal in the radio frequency signal having the desired frequency $f_{RF}$.

As shown in FIG. 9(a), in the case of using the local oscillation signal having the frequency $f_{LO1}$ lower than the frequency $f_{RF}$ of the radio frequency carrier wave, the inductance Lr, and the respective capacitance Cr and Cs satisfy: Lr=4.5 nH, Cr=2 pF, Cs=0.5 pF. In contrast, as shown in FIG. 9(b), in the case of using the local oscillation signal having the frequency $f_{LO1}$ higher than the frequency $f_{RF}$ of the radio frequency carrier wave, the inductance Lr, and the respective capacitance Cr and Cs satisfy: Lr=1.5 nH, Cr=1 pF, Cs=0.1 pF. Namely, the inductance Lr of FIG. 9(b) is one-third of that of FIG. 9(a), and the capacitance Cr of FIG. 9(b) is one-half of that of FIG. 9(a). This allows the image trap filter to be integrated in a smaller circuit.

As described above, the present invention is for providing a transceiver that can increase integration level in a semiconductor substrate, and that can be applied to a half-duplex transceiver, with the use of the integrated circuit technique.

In the present transceiver, the followings become possible:

(1) The integration of all the filters allows reductions of the power consumption, the number of components provided outside an IC chip, and the cost.

(2) The two-stage downconversion in the receiving channel allows an achievement of high selectivity.

(3) Because the first mixer carrying out the first stage downconversion uses the local oscillation signal having a frequency higher than the frequency of the radio frequency carrier wave, the image signal can be suppressed with ease. Further, because the frequency of the image signal is higher than the frequency of the radio frequency carrier wave, it is possible to downsize the image removal filter, thereby allowing the image removal filter to be incorporated in the integration circuit.

(4) It is possible to reduce the power consumption, because a single voltage controlled oscillator and a phase-locked loop circuit are used to generate all the clock signals (local oscillation signals) required for the receiving section.

(5) A pulling effect of a frequency is eliminated, because the voltage controlled oscillator operates at a frequency different from the frequency of the radio frequency carrier wave.

A radio frequency transceiver of the present invention may be a front-end transceiver including: (i) an antenna designed to efficiently operate at a radio frequency (RF) carrier wave having a frequency $f_{RF}$; (ii) a band-pass filter having a pass band including the frequency $f_{RF}$ of the radio frequency carrier wave; (iii) a switch for switching between a signal channel (transmitting channel) for a transmitting mode and a signal channel (receiving channel) for a receiving mode, wherein: the receiving channel includes (a) a low noise amplifier (LNA) for amplifying a received signal having the frequency $f_{RF}$, and for attenuating a band interference signal to such a degree that the band interference signal substantially vanishes, (b) a first mixer, and (c) a quadrature mixer, the first mixer mixing the radio frequency signal with an output signal of a first local oscillator (LO1) having a frequency $f_{LO1}$ higher than the frequency $f_{RF}$ of the radio frequency carrier wave so as to downconvert the received signal into a signal having a lower frequency $f_1$ ($f_1=f_{LO1}-f_{RF}$), the frequency $f_{LO1}$ having a relation with the frequency $f_{RF}$: $f_{LO1}=k \times f_{RF}$ (k>1), k generally falling within a range of 1.125 to 1.35, the quadrature mixer mixing an output signal of the first mixer having the frequency $f_1$ with an output signal of a second local oscillator (LO2) having a frequency $f_{LO2}$ equal to the frequency $f_1$ and a phase of 0°, and with an output signal of the second local oscillator having the frequency $f_{LO2}$ and a phase of 270°, respectively, so as to downconvert the output signal into baseband signals, the frequency $f_{LO2}$ and the frequency $f_{LO1}$ satisfying a relation of $f_{LO2}=f_{LO1}/m$, the coefficients k and m satisfying a relation of k=m/(m−1), m>1, low-pass filtering and amplifying being carried out with respect to each of an in-phase (I) signal and a quadrature (Q) signal of the baseband signals generated by the quadrature mixer, the transmitting channel including: (a) a low-pass filter for limiting each bandwidth of an in-phase component and a quadrature component of an analog signal to which a transmitter signal (signal to be transmitted) is converted; (b) a quadrature modulator made up of (1) a first mixer for mixing the in-phase component of the base-band signals with a radio frequency carrier wave having the frequency $f_{RF}$, and (2) a second mixer for mixing the quadrature component of the base-band signals with the radio frequency carrier wave having the frequency $f_{RF}$, so as to upconvert the base-band signals directly into a radio frequency signal; and (c) an amplifier for substantially amplifying electric power of the signal thus upconverted so as to drive the antenna.

The radio frequency front-end transceiver may be arranged so that the frequency $f_{RF}$ of the radio frequency carrier wave has a following relation with the frequency $f_{LO1}$ of the first local oscillator signal, and with the frequency $f_{LO2}$ of the second local oscillator signal:

$f_{RF}=f_{LO1}-f_{LO2}$, and $f_{RF}=f_{LO1} \times (m-1)/m$

Alternatively, the radio frequency front-end transceiver may be arranged so that the first local oscillator signal and the second local oscillator signals are so generated that m is power of 2, i.e., m satisfies a relation of $m=2^n$ (n=1, 2, ...).

Alternatively, the radio frequency front-end transceiver may be arranged so that the transmitting channel and a clock generating circuit for transmitting the radio frequency carrier wave having the frequency $f_{RF}$ are suspended during the receiving mode.

Alternatively, the radio frequency front-end transceiver is arranged so that the receiving channel includes a filter circuit for reducing 10 dB or greater for a frequency $f_{IM}$ ($f_{IM}=2f_{LO1}-f_{RF}$) or a frequency greater than the frequency $f_{IM}$.

The radio frequency front-end transceiver may be arranged so that a voltage controlled oscillator (VCO), a dividing circuit, a first mixer, and a second mixer cause generations of the first local oscillator signal, the second local oscillator signals, and the clock signals having the radio frequency $f_{RF}$. (a) The voltage controlled oscillator (VCO) operates at the frequency $f_{LO1}$ of the first local oscillator signal, is controlled by a phase-locked loop circuit, and is incorporated (built) in the phase-locked loop circuit. (b) The dividing circuit generates the second local oscillation signals having the frequency $f_{LO2}$ by dividing by m the frequency $f_{LO1}$ of the first local oscillator signal. (c) The first mixer mixes the first local oscillator signal with the second local oscillator signal having the frequency $f_{LO2}$ and a phase of 0° so as to generate the clock signal having the frequency $f_{RF}$ and a phase of 0°. (d) The second mixer mixes the first local oscillator signal with the second local oscillator signal having the frequency $f_{LO2}$ and a phase of 270° so as to generate the clock signal having the frequency $f_{RF}$ and a phase of 90°.

Each of the frequency conversion circuit, the radio frequency receiver, and the radio frequency transceiver of the present invention can be applied to a mobile communication system such as a mobile phone or a PHS (Personal Handyphone System), a wireless data communication system such as a wireless local area network (LAN) communication system, which is compliant with IEEE 802.11x standard. Further, because the present invention has a small size structure, the present invention is useful as an arrangement to be incorporated in a mobile apparatus.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A radio frequency transceiver, comprising:
    a radio frequency receiver for receiving a radio frequency carrier wave having a desired frequency; and
    a radio frequency transmitter for transmitting a carrier wave having a radio frequency,
    said radio frequency receiver, including:
    a frequency conversion circuit for downconverting a radio frequency signal having a desired frequency into two based-band signals having different phases,
    said frequency conversion circuit, including:
    a first mixer for mixing the radio frequency signal with a first oscillation signal so that the radio frequency signal is downconverted into an intermediate frequency signal; and
    a second mixer for mixing the intermediate frequency signal received from the first mixer with two second local oscillation signals having different phases, respectively, so that the intermediate frequency signal is downconverted into the two base-band signals,
    the two local oscillation signals having phases of 0° and 270°, respectively, and
    $f_{LO1}=k \times f_{RF}$, $f_{LO2}=f_{LO1}/m$, and $k=m/(m-1)$ being satisfied, where $f_{RF}$ indicates a frequency of the radio frequency signal, $f_{LO1}$ indicates a frequency of the first local oscillation signal, $f_{LO2}$ indicates a frequency of the second local oscillation signal, k indicates an arbitrary number satisfying k>1, and m indicates an arbitrary number satisfying m>1,
    said radio frequency transmitter, including:
    a quadrature modulator for upconverting the base-bands signals directly into a radio frequency signal having the frequency $f_{RF}$,
    the quadrature modulator, including:
    a third mixer for mixing an in-phase component of the base-band signal with a clock signal having the frequency $f_{RF}$ and a phase of 0°; and
    a fourth mixer for mixing a quadrature component of the base-band signal with a clock signal having the frequency $f_{RF}$ and a phase of 90°,
    said radio frequency transceiver, including a signal generator comprising:
    an oscillator for generating the first local oscillation signal;
    a divider for dividing the frequency of the first local oscillation signal into 1/m so as to generate the second local oscillation signals having phases 0° and 270°, respectively;
    a fifth mixer for the first local oscillation signal generated by the oscillator with the second local oscillation signal, having the phase of 0°, generated by the divider so as to generate the clock signal having the frequency $f_{RF}$ and a phase of 0°, and
    a sixth mixer for mixing the first local oscillation signal generated by the oscillator with the second local oscillation signal, having the phase of 270°, generated by the divider so as to generate the clock signal having the frequency $f_{RF}$ and a phase of 90°.

2. The radio frequency transceiver as set forth in claim 1, wherein:
    the radio frequency transmitter further includes:
    a low-pass filter for limiting bandwidth of in-phase component and quadrature component of base-band signals obtain by carrying out analog conversion with respect to a digit data that is to be transmitted; and
    an amplifier for amplifying electric power of the radio frequency signal upconverted by the quadrature modulator.

3. The radio frequency transceiver as set forth in claim 1, wherein:
    the signal generator generates the first local oscillation signal and the second local oscillation signals, and sends the first and second local oscillation signals to the frequency conversion circuit provided in the radio frequency receiver; and
    the signal generator generates clock signals used for the upconversion in the radio frequency transmitter, and sends the clock signals to the radio frequency transmitter.

4. The radio frequency transceiver as set forth claim 3, further comprising:
    an antenna for receiving the radio frequency carrier wave, the antenna being so designed as to operate efficiently at the desired frequency; and
    switching means for switching between (i) a receiving mode in which the switching means connects the antenna to the radio frequency receiver and (ii) a transmitting mode in which the switching means connects the antenna to the radio frequency transmitter,
    circuit components, for generating the clock signal generator stopping operating during the receiving mode.

* * * * *